(12) United States Patent
Shirakawa et al.

(10) Patent No.: US 10,600,897 B2
(45) Date of Patent: Mar. 24, 2020

(54) SEMICONDUCTOR DEVICE

(71) Applicant: FUJI ELECTRIC CO., LTD., Kawasaki (JP)

(72) Inventors: Tohru Shirakawa, Matsumoto (JP); Yoshiharu Kato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/174,905

(22) Filed: Oct. 30, 2018

(65) Prior Publication Data

US 2019/0140084 A1 May 9, 2019

(30) Foreign Application Priority Data

Nov. 8, 2017 (JP) ................................. 2017-215990
Jul. 19, 2018 (JP) ................................. 2018-135626

(51) Int. Cl.
| | |
|---|---|
| *H01L 29/43* | (2006.01) |
| *H01L 29/739* | (2006.01) |
| *H01L 29/10* | (2006.01) |
| *H01L 29/417* | (2006.01) |
| *H01L 29/423* | (2006.01) |

(Continued)

(52) U.S. Cl.
CPC .... *H01L 29/7397* (2013.01); *H01L 21/28512* (2013.01); *H01L 29/0615* (2013.01); *H01L 29/0619* (2013.01); *H01L 29/0638* (2013.01); *H01L 29/0649* (2013.01); *H01L 29/0696* (2013.01); *H01L 29/1095* (2013.01); *H01L 29/404* (2013.01); *H01L 29/417* (2013.01); *H01L 29/41708* (2013.01);

(Continued)

(58) Field of Classification Search
CPC ............ H01L 29/1095; H01L 29/7397; H01L 29/0696; H01L 29/7396; H01L 29/4238; H01L 29/41078; H01L 29/66348; H01L 29/66333; H01L 29/7393; H01L 29/7395; H01L 2924/13055
See application file for complete search history.

(56) References Cited

U.S. PATENT DOCUMENTS

2007/0228518 A1 10/2007 Yilmaz et al.
2011/0006338 A1 1/2011 Senoo
(Continued)

FOREIGN PATENT DOCUMENTS

JP 2008227237 A 9/2008
JP 2009200098 A 9/2009
(Continued)

*Primary Examiner* — Hsien Ming Lee

(57) ABSTRACT

In an edge termination region, in a carrier drawing region between an active region and a gate runner part, a $p^+$-type contact region is provided in a surface region of a p-type well region. In the carrier drawing region, in second contact holes formed an interlayer insulating film, a contact plug is embedded in each via the barrier metal, and contacts of the $p^+$-type contact region and the barrier metal at an emitter electric potential are formed. The contacts of the carrier drawing region are disposed in a striped layout extending along an outer periphery of the active region; the contacts surround the active region. A contact resistance of the contacts of the carrier drawing region is higher than a contact resistance of a contact (emitter contact) of a MOS gate.

19 Claims, 20 Drawing Sheets

(51) Int. Cl.
  *H01L 29/40* (2006.01)
  *H01L 21/285* (2006.01)
  *H01L 29/45* (2006.01)
  *H01L 29/06* (2006.01)

(52) U.S. Cl.
  CPC ........ *H01L 29/4238* (2013.01); *H01L 29/456* (2013.01); *H01L 29/7396* (2013.01)

(56) References Cited

U.S. PATENT DOCUMENTS

| | | |
|---|---|---|
| 2012/0080718 A1 | 4/2012 | Soeno |
| 2012/0326207 A1* | 12/2012 | Yoshimochi ......... H01L 29/866 257/139 |
| 2014/0159107 A1 | 6/2014 | Kurata et al. |
| 2015/0014741 A1 | 1/2015 | Chen et al. |
| 2016/0204237 A1 | 7/2016 | Chen et al. |

FOREIGN PATENT DOCUMENTS

| | | |
|---|---|---|
| JP | 2009532880 A | 9/2009 |
| JP | 201321104 A | 1/2013 |
| WO | 2010143288 A1 | 12/2010 |
| WO | 2013035818 A1 | 3/2013 |
| WO | 2013132568 A1 | 9/2013 |

* cited by examiner

SEMICONDUCTOR DEVICE

CROSS REFERENCE TO RELATED APPLICATIONS

This application is based upon and claims the benefit of priority of the prior Japanese Patent Application Nos. 2017-215990 filed on Nov. 8, 2017, and 2018-135626 filed on Jul. 19, 2018, the entire contents of which are incorporated herein by reference.

BACKGROUND

1. Field

Embodiments of the invention relate to a semiconductor device.

2. Description of Related Art

Conventionally, a MOS semiconductor device having a MOS gate (insulated gate constituted by a metal oxide semiconductor of 3-layer structure) is commonly known to include an active region and an edge termination region surrounding a periphery of the active region. In a MOS semiconductor device, near a boundary of the edge termination region with the active region, a contact (electrical contact part) is provided for drawing out holes toward a front electrode, the holes being minority carriers generated in the edge termination region at the time of turn OFF of the MOS semiconductor device (for example, refer to International Publication No. WO 2013/035818, Published Japanese-Translation of PCT Application, Publication No. 2009-532880, International Publication No. WO 2013/132568, Japanese Laid-Open Patent Publication No. 2009-200098). In International Publication No. WO 2013/035818, Published Japanese-Translation of PCT Application, Publication No. 2009-532880, International Publication No. WO 2013/132568 and Japanese Laid-Open Patent Publication No. 2009-200098, a single contact surrounding the periphery of the active region is formed by a contact region and a metal electrode.

A structure of a conventional semiconductor device will be described taking a trench gate insulated gate bipolar transistor (IGBT) as an example. FIG. 10 is a cross-sectional view of a structure of the conventional semiconductor device. FIG. 11 is an enlarged cross-sectional view of a structure of a carrier drawing region in FIG. 10. FIG. 12 is a plan view of a layout of a part of FIG. 10 as viewed from a front surface side of a semiconductor substrate (semiconductor chip). FIG. 10 depicts a cross-sectional view along cutting line AA-AA' in FIG. 12. In FIG. 10, a MOS gate 120 and a carrier drawing region 105 of an active region 101 are not depicted.

FIG. 11 depicts a cross-sectional view of a contact 127 of the MOS gate 120 and a contact 150 of the carrier drawing region 105 in the active region 101. FIG. 12 depicts a part of an edge termination region 102 that surrounds a periphery of the active region 101 in a non-depicted substantially rectangular shape. Further, in FIG. 12, a layout of an interlayer insulating film 121 (hatched portion), a gate runner 142 (portion between vertical dashed lines) of the gate runner part 104, and the contact 150 of the carrier drawing region 105 a gate runner part 104 and the carrier drawing region 105 are depicted while parts of the active region 101 and a breakdown voltage structure part 103 are not depicted.

The conventional semiconductor device depicted in FIGS. 10 to 12 is a vertical IGBT having the active region 101 and the edge termination region 102 on a semiconductor substrate 110. On a front surface side of the semiconductor substrate 110, the MOS gate 120 having a trench gate structure is provided in the active region 101, and a breakdown voltage structure 130 is provided in the edge termination region 102 and is constituted by a field limiting ring (FLR) 131, a field plate 132, etc. Hereinafter, a part of the edge termination region 102 in which the breakdown voltage structure 130 is disposed is regarded as the breakdown voltage structure part 103.

On the front surface of the semiconductor substrate 110, the gate runner 142 is provided between the active region 101 and the breakdown voltage structure part 103, via an insulating layer 141. The gate runner 142 surrounds a periphery of the active region 101 in a non-depicted substantially rectangular shape. The gate runner 142 is electrically connected with a gate metal wiring 144 of a gate potential, in a contact hole 143. Further, the gate runner 142 is electrically connected with all gate electrodes 117 of the MOS gates 120. Hereinafter, the part of the edge termination region 102 in which the gate runner 142 is disposed is regarded as the gate runner part 104.

In a surface layer at the front surface of the semiconductor substrate 110, a p-type well region 151 is provided from a boundary of the breakdown voltage structure part 103 and the gate runner part 104, to a boundary of the active region 101 and the edge termination region 102. A pn junction of the p-type well region 151 and an n$^-$-type drift region 111 is a main junction part 152 that transmits voltage at the time of turn OFF of the IGBT, from the active region 101 to the edge termination region 102. In a surface region (the surface layer at the front surface of the semiconductor substrate 110) of the p-type well region 151, a p$^+$-type contact region 153 is provided spanning substantially the entire surface between the active region 101 and the gate runner part 104. The p$^+$-type contact region 153 surrounds a periphery of the active region 101 in a non-depicted substantially rectangular shape.

Substantially, the entire surface of the p$^+$-type contact region 153 is exposed by one contact hole 154 provided in the interlayer insulating film 121. Further, an emitter electrode 122 extending from the active region 101 is embedded in the contact hole 154. In the contact hole 154, the emitter electrode 122 is in contact with the p$^+$-type contact region 153 and through the p$^+$-type contact region 153 is electrically connected with the p-type well region 151. The emitter electrode 122 is, for example, an aluminum-silicon (Al—Si) electrode containing aluminum as a main component. Reference numerals 112, 113 are a p-type base region and a p$^+$-type contact region of the MOS gate 120, respectively. Reference numerals 108, 109, 128 are an n-type field stopper region, a p$^+$-type collector region, and a collector electrode, respectively.

In other words, the one contact hole 154 exposing substantially the entire surface of the p$^+$-type contact region 153 is provided between the active region 101 and the gate runner part 104. In the contact hole 154, one contact (electrical contact part) 150 of the p$^+$-type contact region 153 and the emitter electrode 122 is formed. The contact 150 surrounds a periphery of the active region 101 in a non-depicted substantially rectangular shape. The contact 150 has a function of drawing out holes toward the emitter electrode 122, the holes being minority carriers generated in the edge termination region 102 at the time of turn OFF of the IGBT. Hereinafter, a part of the edge termination region 102 in which the contact 150 is disposed is regarded as the carrier drawing region 105. Provision of the contact 150 prevents destruction by drawing out carriers accumulated in the edge termination region 102 at the time of switching.

Further, a device having an n-type carrier storage region that has an impurity concentration higher than that of an n⁻-type drift region has been proposed as an IGBT that suppresses minority carrier behavior during operation (for example, refer to International Publication No. WO 2010/143288, Japanese Laid-Open Patent Publication No. 2008-227237, Japanese Laid-Open Patent Publication No. 2013-021104). FIG. 19 is a cross-sectional view of a structure of another conventional semiconductor device. FIG. 19 is FIG. 1 of International Publication No. WO 2010/143288. The conventional semiconductor device depicted in FIG. 19 is a reverse conducting IGBT (RC-IGBT) having an IGBT element region 201 in which an IGBT is provided, a diode element region 202 in which a diode is provided, and a boundary region 203 between the IGBT element region 201 and the diode element region 202 built into a single semiconductor substrate 210.

In the boundary region 203, a p-type well region 213 is provided in contact with a p-type base region 211 of the IGBT and a p-type region 212' of the diode. The p-type region 212' of the diode is fixed at an anode electric potential through a p⁺-type anode region 212. The p-type well region 213 of the boundary region 203 reaches deeper toward a collector from a main surface on an emitter side of the semiconductor substrate 210 than do the p-type base region 211 of the IGBT and the p-type region 212' of the diode, and is separated from the IGBT element region 201 and the diode element region 202. In the p-type base region 211 of the IGBT and in the p-type well region 213 of the boundary region 203, first and second n-type carrier storage regions 221, 222 of a floating electric potential are provided, respectively.

The first n-type carrier storage region 221 is provided between a part 211a of the p-type base region 211 of the IGBT toward an emitter and a part 211b toward the collector, the first n-type carrier storage region 221 being in contact with both parts 211a, 211b. The second n-type carrier storage region 222 is provided at a predetermined depth in the p-type well region 213 of the boundary region 203, penetrating the p-type well region 213 in a direction parallel to the main surface of the semiconductor substrate 210. One end of the second n-type carrier storage region 222 extends toward the IGBT element region 201 until being in contact with the first n-type carrier storage region 221 of the IGBT element region 201. The other end of the second n-type carrier storage region 222 reaches inside the p-type region 212' of the diode. Reference numeral 204 is an edge termination region.

In the conventional RC-IGBT depicted in FIG. 19, during IGBT operation, hole density near a boundary of an n⁻-type drift region 214 with the p-type base region 211 is high due to the first n-type carrier storage region 221. Additionally, hole movement from the n⁻-type drift region 214 of the IGBT element region 201 toward the diode element region 202 is suppressed by the second n-type carrier storage region 222. As a result, ON voltage of the IGBT is reduced. Further, during diode operation, accumulation of holes in the n⁻-type drift region 214 of the boundary region 203 is suppressed by the second n-type carrier storage region 222. Therefore, during reverse recovery of the diode, reverse recovery current decreases, and element breakdown during reverse recovery of the diode is suppressed.

In Japanese Laid-Open Patent Publication No. 2008-227237, an n-type carrier storage region is provided in a p-type base region of the IGBT in the active region and in a p-type RESURF layer of the edge termination region. The n-type carrier storage regions, at predetermined depths in the p-type base region and in the p-type RESURF layer, respectively, extend in a direction parallel to a main surface of a semiconductor substrate and are in contact with each other. Hole concentration in the p-type base region is increased and ON voltage of the IGBT is reduced by the n-type carrier storage region in the p-type base region of the IGBT. Charge balance between an n⁻-type drift region and the p-type RESURF layer during avalanche is suppressed and breakdown voltage variation of the IGBT is minimized by the n-type carrier storage region in the p-type RESURF layer.

In Japanese Laid-Open Patent Publication No. 2013-021104, an n-type carrier storage region is provided in a p-type base region of the IGBT, in a p-type anode region of the diode, and in a breakdown voltage structure constituted by a p-type diffusion region of the edge termination region. Hole concentration in the p-type base region increases and ON voltage of the IGBT decreases due to the n-type carrier storage region in the p-type base region. Hole injection and emission amounts in a diode region become uniform and diode recovery capability increases due to the n-type carrier storage region in the p-type anode region. The n-type carrier storage region in the breakdown voltage structure suppresses current flowing near the breakdown voltage structure from becoming inconsistent during diode recovery and suppresses destruction due to a concentration of current.

SUMMARY

According to an embodiment of the invention, a semiconductor device includes an active region through which main current flows, the active region provided in a semiconductor substrate of a first conductivity type; a termination region surrounding a periphery of the active region; a first semiconductor region of a second conductivity type provided in the active region, in a surface layer on a first main surface side of the semiconductor substrate; a second semiconductor region of the first conductivity type selectively provided in the first semiconductor region; a third semiconductor region of the second conductivity type selectively provided in the first semiconductor region, the third semiconductor region having an impurity concentration that is higher than an impurity concentration of the first semiconductor region; a fourth semiconductor region of the second conductivity type selectively provided in the termination region, in the surface layer on the first main surface side of the semiconductor substrate; a fifth semiconductor region of the first conductivity type that is a region of the semiconductor substrate excluding the first semiconductor region and the fourth semiconductor region; a gate insulating film provided in contact with a region of the first semiconductor region, the region between the fifth semiconductor region and the second semiconductor region; a gate electrode provided opposing the first semiconductor region, across the gate insulating film; an interlayer insulating film provided on a first main surface of the semiconductor substrate and covering the second semiconductor region, the third semiconductor region, the fourth semiconductor region and the gate electrode; a first contact hole opened in the interlayer insulating film and exposing the second semiconductor region and the third semiconductor region; a plurality of second contact holes opened in the interlayer insulating film, each of the plurality of second contact holes selectively exposing the fourth semiconductor region; a first metal film provided along inner walls of the plurality of second contact holes, the first metal film having a high adhesive property with the semiconductor substrate and forming an ohmic contact with the semiconductor substrate; a second metal film embedded on the first metal film, in the plurality of second contact holes; a first electrode provided on the interlayer insulating film and electrically connected with the first semiconductor region via the second semiconductor region and the third semiconductor region, in the first contact hole, the first electrode further electrically connected with the fourth semiconductor region via the second metal film and the first metal film, in the plurality of second contact holes; and a second electrode provided at a second main surface of the semiconductor substrate.

In the embodiment, the semiconductor device further includes a sixth semiconductor region of the second conductivity type selectively provided in the fourth semiconductor region, the sixth semiconductor region having an impurity concentration that is higher than the impurity concentration of the third semiconductor region. The first electrode is electrically connected with the fourth semiconductor region via the second metal film, the first metal film and the sixth semiconductor region, in the plurality of second contact holes.

In the embodiment, the semiconductor device further includes a seventh semiconductor region of the second conductivity type selectively provided in the third semiconductor region, the seventh semiconductor region having an impurity concentration that is higher than the impurity concentration of the third semiconductor region. The first electrode is electrically connected with the first semiconductor region via the seventh semiconductor region and the third semiconductor region, in the first contact hole.

In the embodiment, the fourth semiconductor region surrounds the periphery of the active region along an outer periphery of the active region. The plurality of second contact holes are disposed in a striped layout extending along the outer periphery of the active region and surround the periphery of the active region.

In the embodiment, a width of the plurality of second contact holes is in a range from 0.3 µm to 1.0 µm.

In the embodiment, a width between the plurality of second contact holes is equal to the width of the plurality of second contact holes.

In the embodiment, the semiconductor device further includes a gate pad provided on the first main surface of the semiconductor substrate via an insulating layer, in the termination region, the gate pad opposing the fourth semiconductor region, across the insulating layer, and electrically connected with the gate electrode. The plurality of second contact holes are provided from a boundary of the active region and the termination region to the gate pad.

In the embodiment, a distance from the boundary of the active region and the termination region to the gate pad is at least 5 µm.

In the embodiment, the first electrode forms an ohmic contact with second semiconductor region and with the third semiconductor region.

In the embodiment, the first metal film is provided along an inner wall of the first contact hole. The second metal film is embedded on the first metal film, the first contact hole.

In the embodiment, the first metal film contains titanium as a main material.

In the embodiment, the second metal film contains tungsten as a main material.

In the embodiment, the semiconductor device further includes a trench that reaches the fifth semiconductor region from a top of the first semiconductor region. The gate insulating film is provided along an inner wall of the trench. The gate electrode is embedded in the gate insulating film in the trench.

In the embodiment, the semiconductor device further includes an eighth semiconductor region of the first conductivity type between the first semiconductor region and the fifth semiconductor region, the eighth semiconductor region having an impurity concentration that is higher than an impurity concentration of the fifth semiconductor region.

In the embodiment, the semiconductor device further includes a ninth semiconductor region of the first conductivity type in the fourth semiconductor region, the ninth semiconductor region being separated from the first main surface of the semiconductor substrate and opposing the plurality of second contact holes in a depth direction, the ninth semiconductor region having an impurity concentration that is higher than the impurity concentration of the fifth semiconductor region.

In the embodiment, the semiconductor device further includes a gate pad provided on the first main surface of the semiconductor substrate via an insulating layer, in the termination region, the gate pad opposing the fourth semiconductor region, across the insulating layer in the depth direction, and electrically connected with the gate electrode. The ninth semiconductor region extends from an active region side toward a gate pad side, and terminates further on the active region side than does the gate pad.

In the embodiment, the ninth semiconductor region is positioned at a depth from the first main surface of the semiconductor substrate equal to a depth of the eighth semiconductor region.

In the embodiment, the ninth semiconductor region is positioned at a depth from the first main surface of the semiconductor substrate shallower than a depth of the eighth semiconductor region.

In the embodiment, the semiconductor device further includes a trench that reaches the fifth semiconductor region from a top of the first semiconductor region. The gate insulating film is provided along an inner wall of the trench. The gate electrode is embedded in the gate insulating film in the trench. The trench is disposed in plural in a striped shape extending along a direction parallel to the first main surface of the semiconductor substrate. The second semiconductor region is provided between all adjacent trenches.

Objects, features, and advantages of the present invention are specifically set forth in or will become apparent from the following detailed description of the invention when read in conjunction with the accompanying drawings.

DESCRIPTION OF EMBODIMENTS

Figure 10:
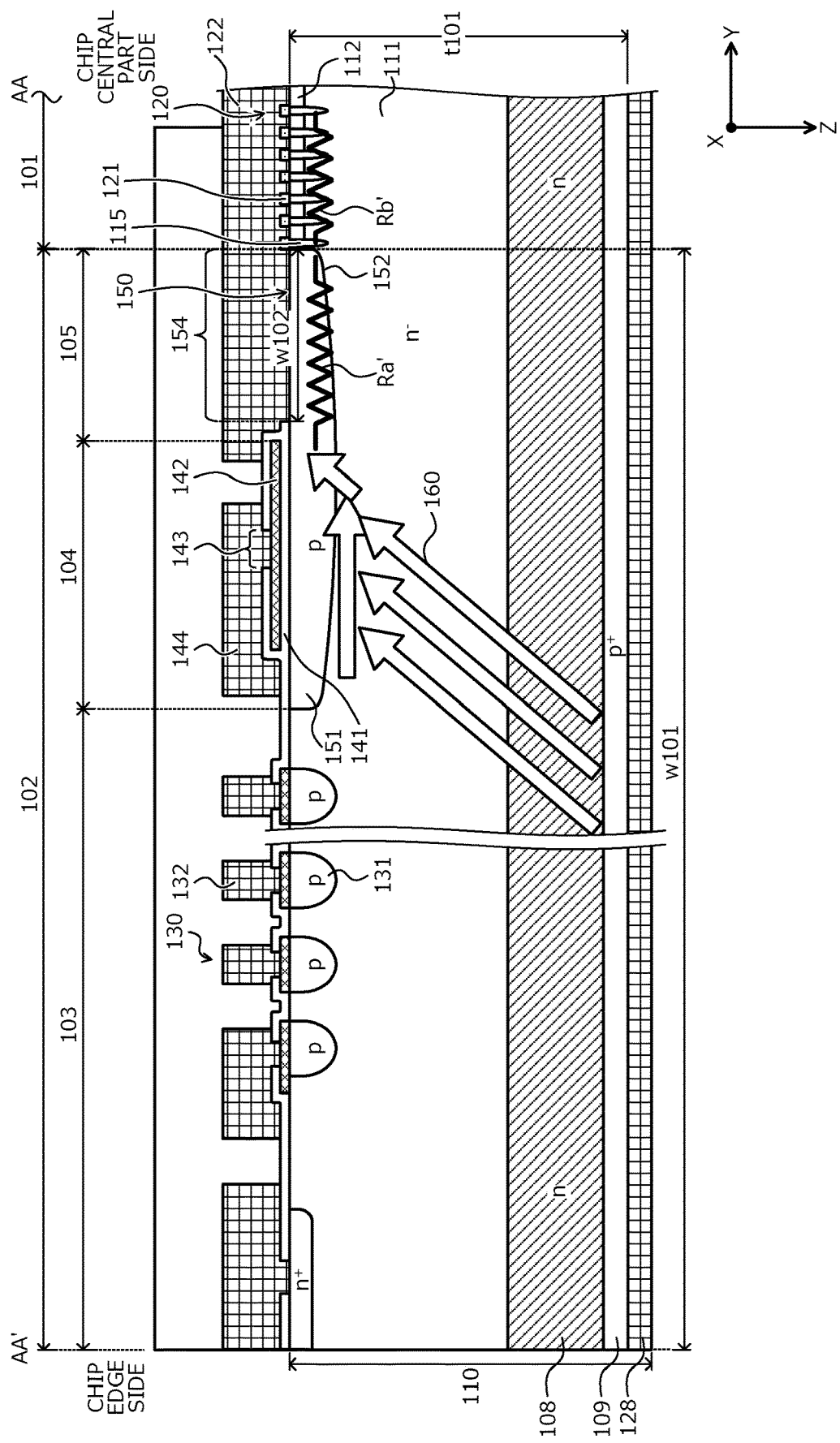
FIG. 10 is a cross-sectional view of a structure of a conventional semiconductor device.
Figure 11:
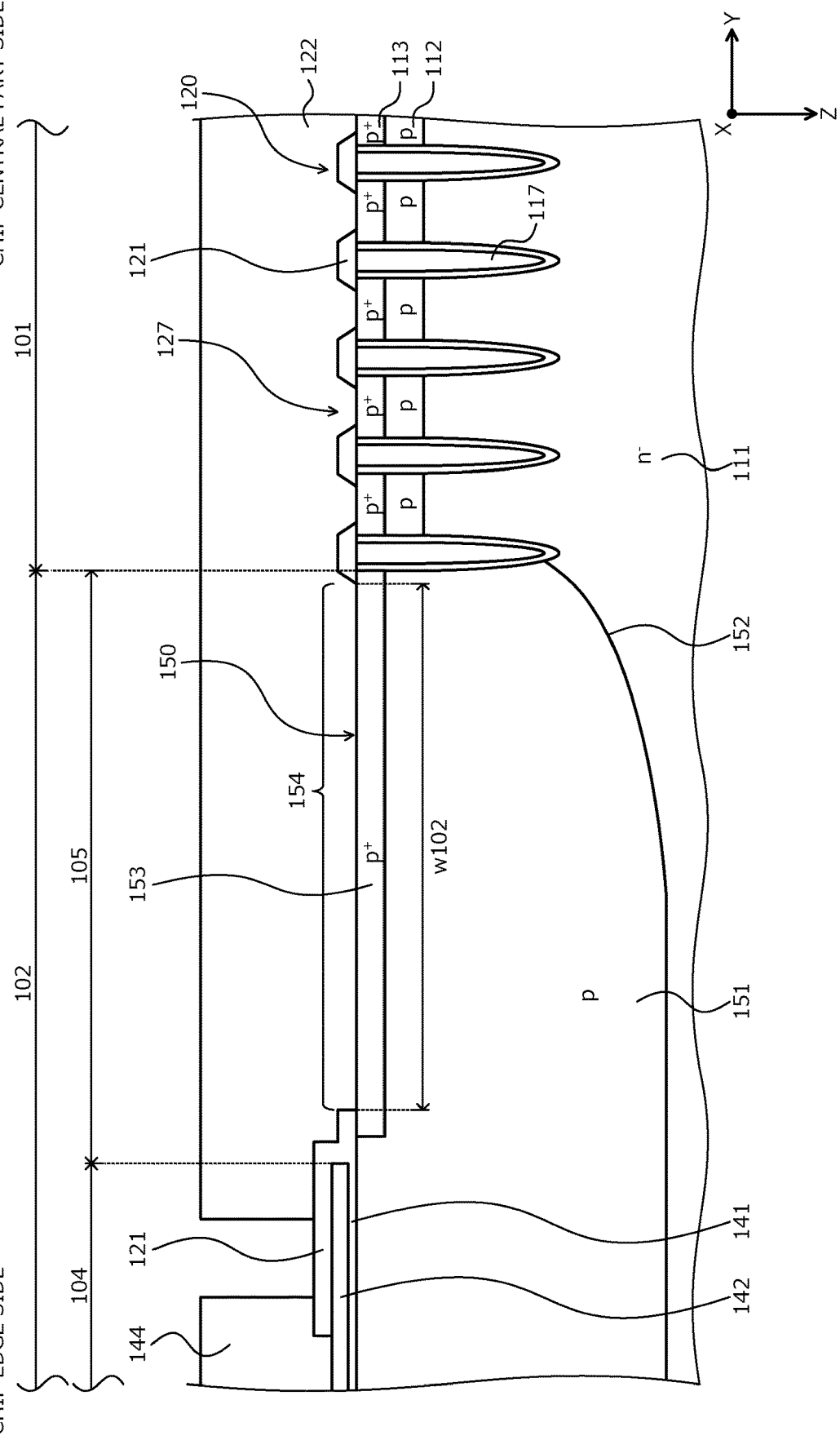
FIG. 11 is an enlarged cross-sectional view of a structure of a carrier drawing region in FIG. 10.
Figure 12:
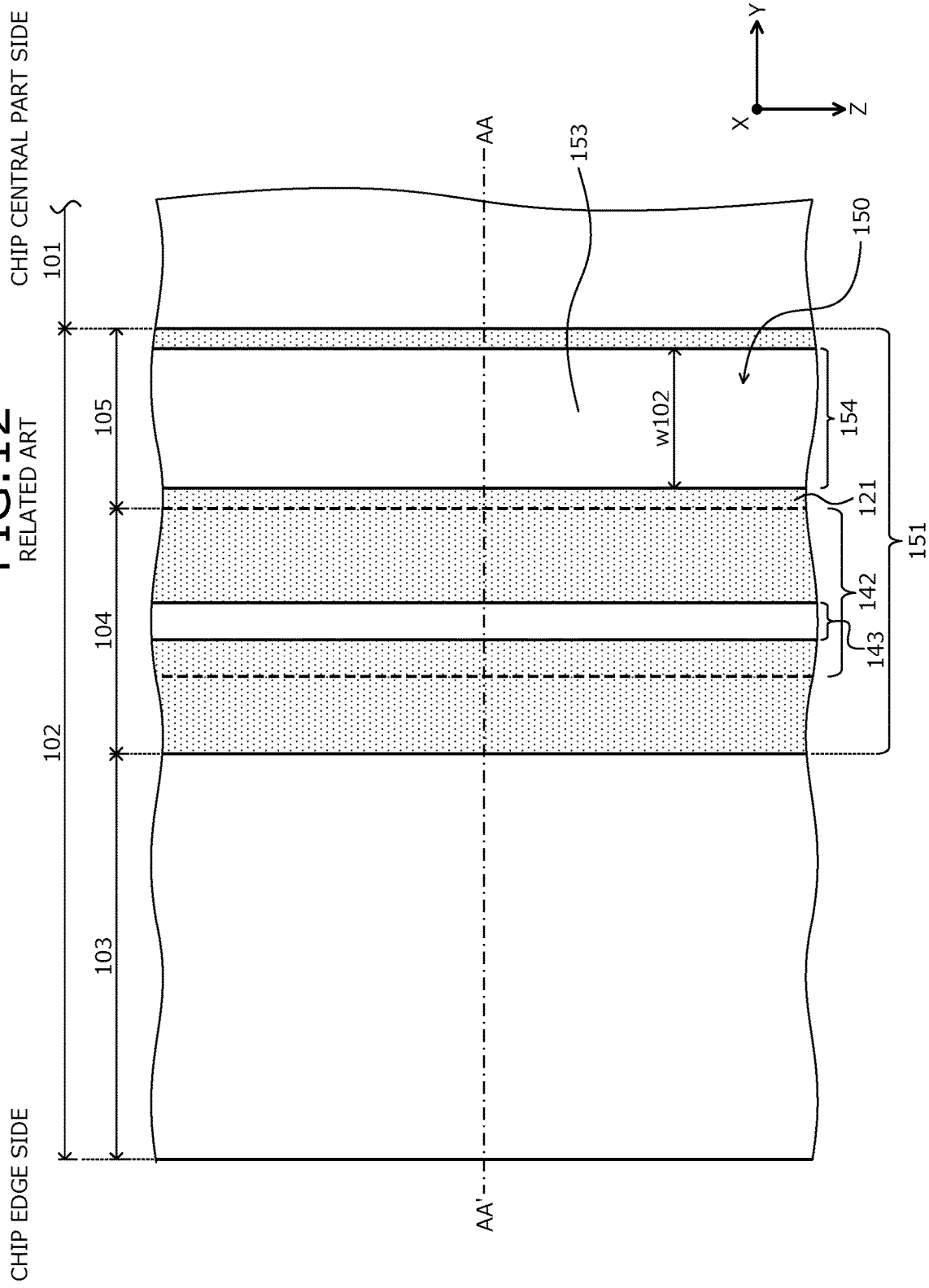
FIG. 12 is a plan view of a layout of a part of FIG. 10 as viewed from a front surface side of a semiconductor substrate.

First, problems associated with the conventional techniques will be described. In the conventional semiconductor device (refer to FIGS. 10, 11), when a width w101 of the edge termination region 102 is narrow, a thickness t101 of the semiconductor substrate 110 is thin, and an interval between adjacent gate trenches (trenches in which the MOS gate 120 is embedded) is narrow, breakdown voltage of the edge termination region 102 decreases and easily becomes lower than breakdown voltage of the active region 101. Therefore, avalanche current flows in the edge termination region 102, particularly, for example, when the width w101 of the edge termination region 102 is about 300 μm or less, and the thickness t101 of the semiconductor substrate 110 is 80 μm or less.

To avoid such problems, when a width w102 of the contact 150 of the carrier drawing region 105 is increased, contact resistance Ra' of the contact 150 of the carrier drawing region 105 becomes lower than a contact resistance Rb' of the contact 127 of the emitter electrode 122 with the p+-type contact region 113 and an n+-type emitter region (not depicted) of the MOS gate 120 in the active region 101. Therefore, at the time of turn OFF of the IGBT, hole current (white arrows: avalanche current) 160 originating at the edge termination region 102 and flowing toward the active region 101 during avalanche is easily drawn from the p-type well region 151 toward the emitter electrode 122 and current easily concentrates near a boundary of the gate runner 142 and a contact hole (hereinafter, current drawing part) 154 constituting a current drawing part.

When the hole current 160 generated at the edge termination region 102 concentrates near a boundary of the gate runner 142 and the current drawing part 154, overall element avalanche capability easily decreases. For example, when two IGBTs constituting a bridge circuit are alternately turned ON and OFF to move an inductive load (L load) such as that of a motor or the like, transient voltage due to an inductance component of the inductive load is applied to the IGBT that is turned OFF. Therefore, the hole current 160 generated in the edge termination region 102 concentrates near the boundary of the gate runner 142 and the current drawing part 154, and current concentrates at the carrier drawing region 105, leading to destruction of the IGBT.

Further, when the two IGBTs constituting the bridge circuit are both in an ON state, short-circuit current flowing in the IGBTs is 5 to 8 times the rated current. Therefore, time rate of change of current di/dt of the IGBTs increases and when the short-circuit current is blocked, a voltage value of surge voltage applied to the IGBTs easily increases. The IGBTs self-clamp and turn OFF; and the avalanche state continues due to the surge voltage, whereby the hole current 160 generated in the edge termination region 102 concentrates near the boundary of the gate runner 142 and the current drawing part 154, leading to destruction of the IGBT at the carrier drawing region 105.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
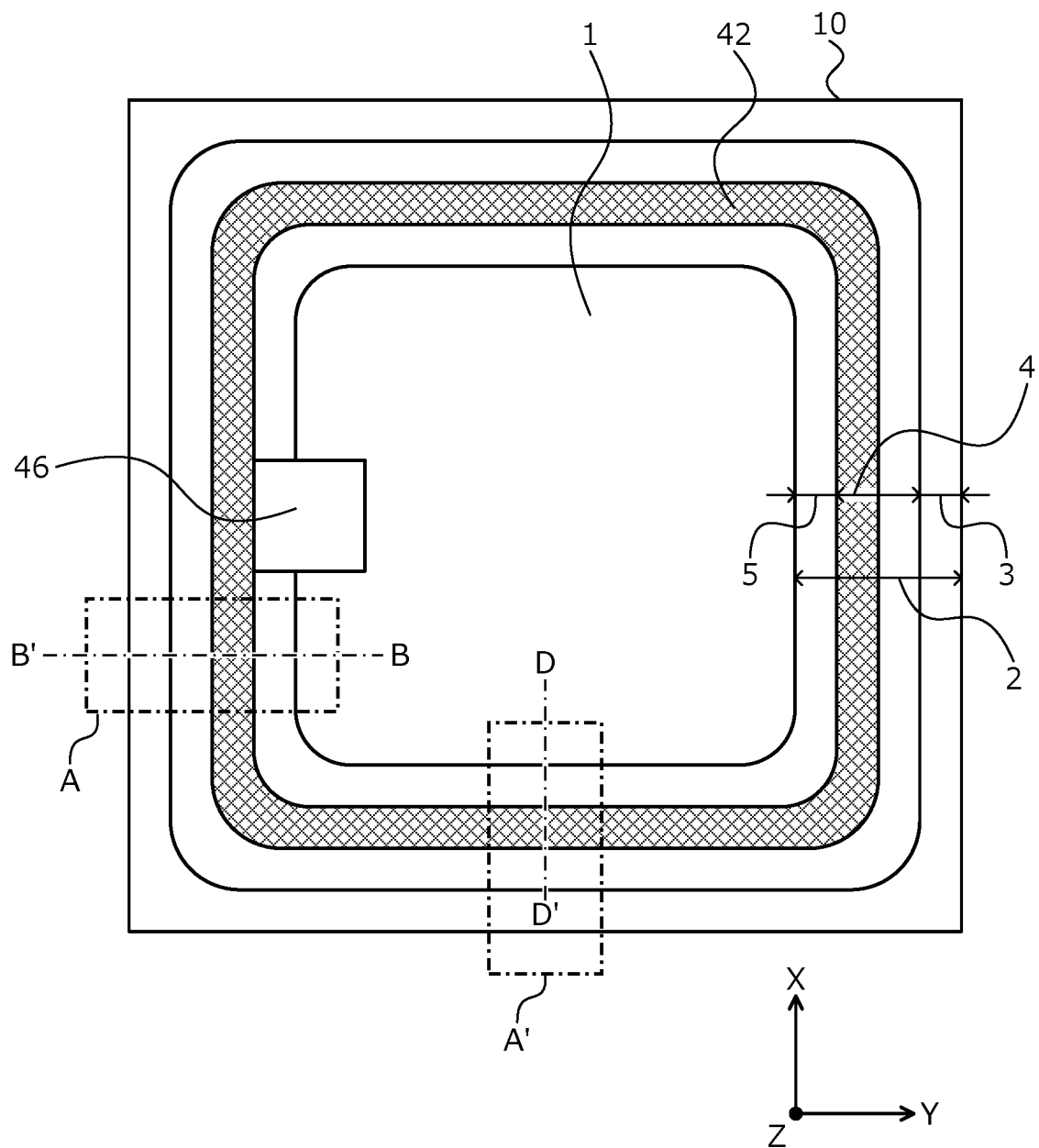
FIG. 1 is a plan view of a layout of a semiconductor device according to a first embodiment as viewed from a front surface of a semiconductor substrate (semiconductor chip)
Figure 2:
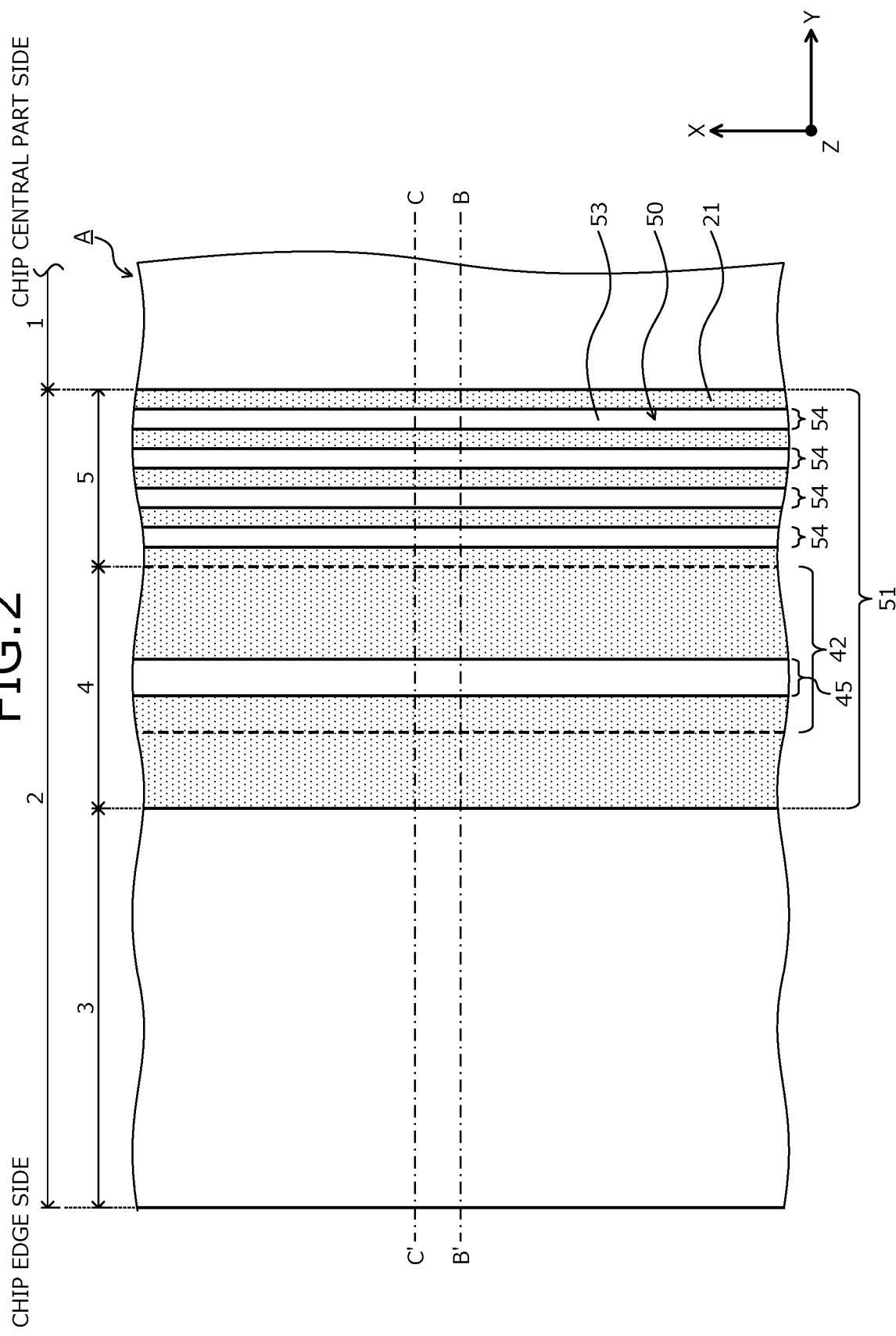
FIG. 2 is an enlarged plan view of a part of FIG. 1.
Figure 3:
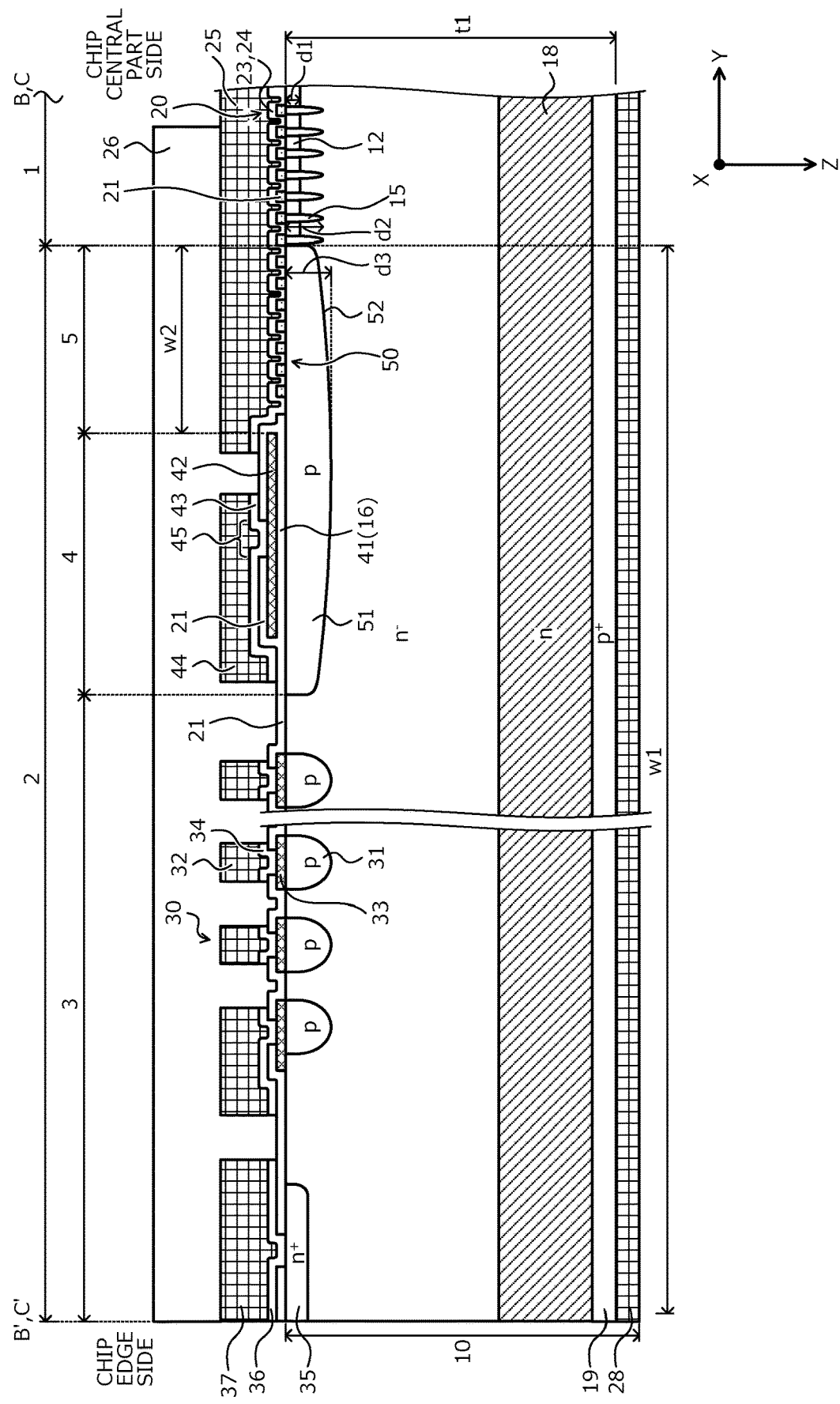
FIG. 3 is a cross-sectional view of a structure of the semiconductor device according to the first embodiment.
Figure 5:
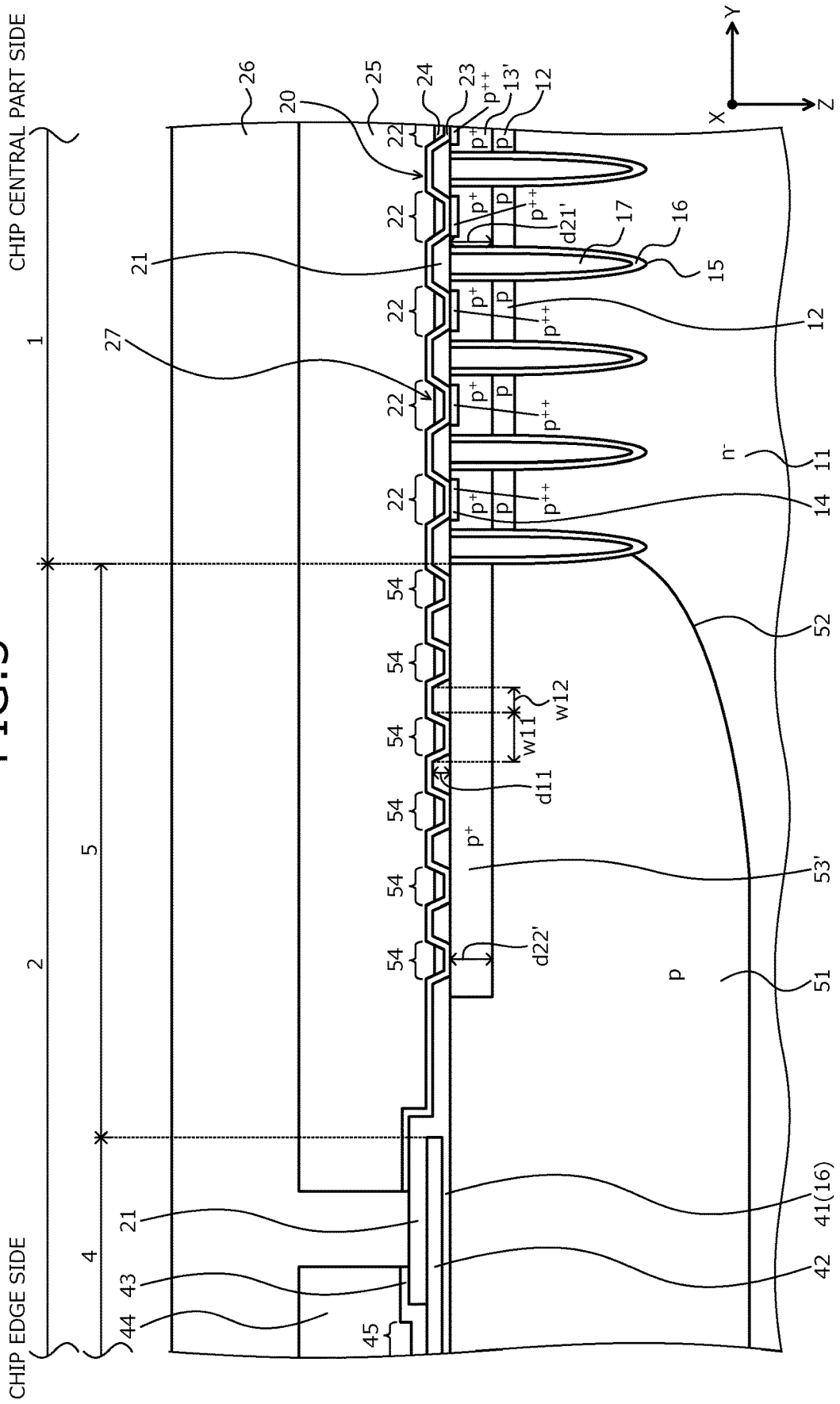
FIG. 5 is an enlarged cross-sectional view of the structure of the carrier drawing region in FIG. 3.
Figure 6:
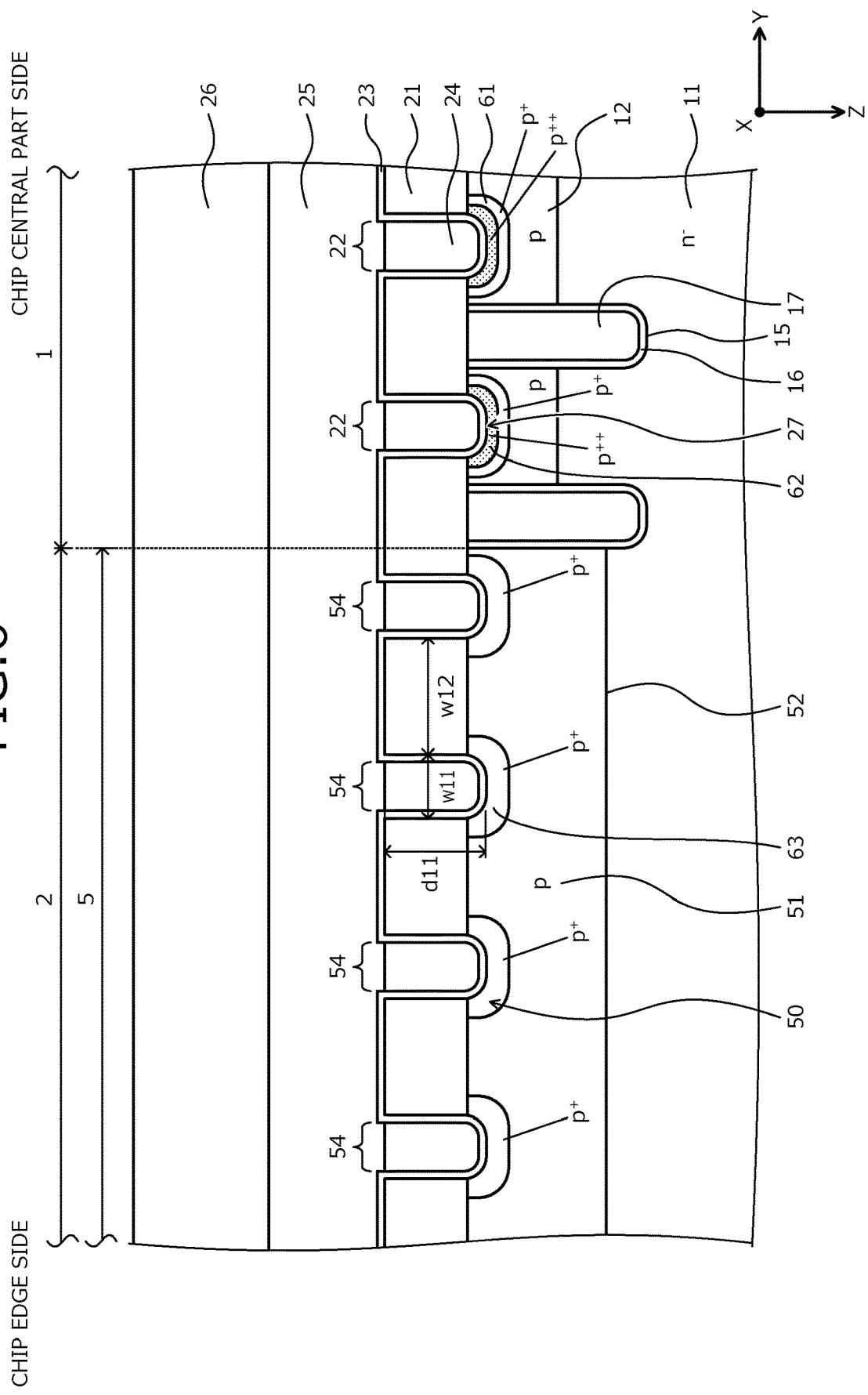
FIG. 6 is an enlarged cross-sectional view of the structure of the carrier drawing region in FIG. 3.
Figure 7:
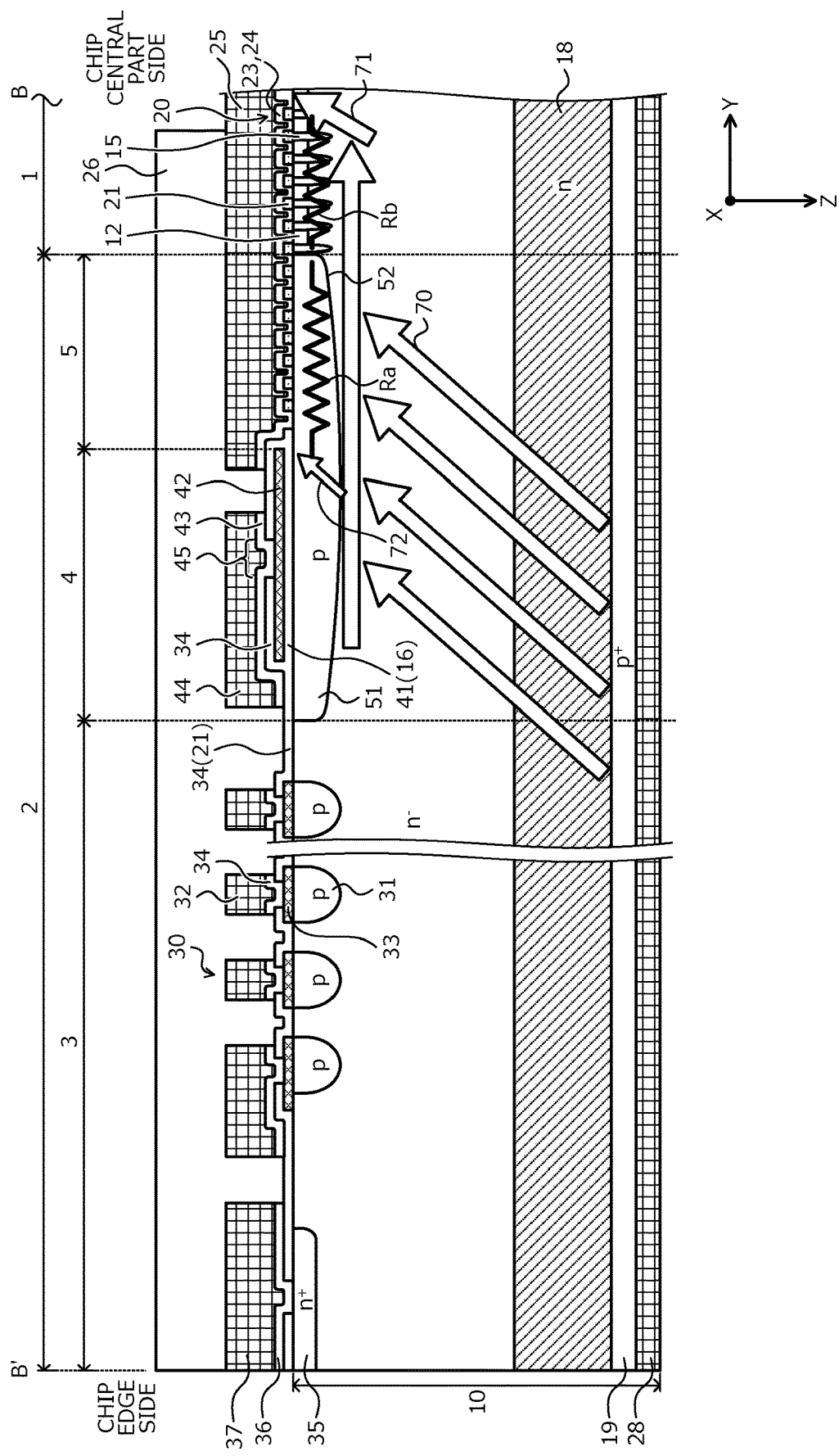
FIG. 7 is a diagram of hole current flow at the time of turn OFF of the semiconductor device according to the first embodiment.

A trench gate type IGBT will be described as an example of a structure of the semiconductor device according to a first embodiment. FIG. 1 is a plan view of a layout of the semiconductor device according to the first embodiment as viewed from a front surface of a semiconductor substrate (semiconductor chip). FIG. 2 is an enlarged plan view of a part of FIG. 1. FIG. 3 is a cross-sectional view of a structure of the semiconductor device according to the first embodiment. FIGS. 4A, 4B, 5, and 6 are enlarged cross-sectional views of a structure of a carrier drawing region in FIG. 3. FIG. 7 is a diagram of hole current (avalanche current) flow at the time of turn OFF of the semiconductor device according to the first embodiment.

FIG. 2 depicts a part surrounded by a rectangular frame A in FIG. 1 and depicts parts of an active region 1 and an edge termination region 2 spanning from near a boundary of the active region 1 and the edge termination region 2 to a chip edge. FIG. 2 depicts a layout of an interlayer insulating film 21 (hatched portion) in a gate runner part 4; and a carrier drawing region 5, a gate runner 42 (portion between vertical dashed lines) of the gate runner part 4, and contacts (electrical contact parts) 50 of the carrier drawing region 5.

Further, in FIG. 2, parts of the active region 1 and a breakdown voltage structure part 3, and an electrode pad (emitter electrode (first electrode) 25) and a polyimide protective film 26 in the gate runner part 4 and the carrier drawing region 5 are not depicted. Cutting line B-B' and cutting line C-C' in FIG. 2 are cutting lines passing through a gate insulating film 16 and a gate electrode 17 provided in each trench 15.

In particular, for example, when the trenches 15 are disposed in a striped shape extending along a direction (hereinafter, the first direction) X parallel to a front surface of the semiconductor substrate 10, cutting line B-B' and cutting line C-C' in FIG. 2 are cutting lines parallel to the front surface of the semiconductor substrate 10 and parallel to a direction (hereinafter, second direction) Y that is orthogonal to the first direction. Additionally, in FIG. 2, cutting line B-B' is a cutting line that does not pass through an $n^+$-type emitter region 29 and cutting line C-C' is a cutting line that passes through the $n^+$-type emitter region 29.

For example, the trenches 15 are assumed to be disposed in a striped shape extending along the first direction X, and the $n^+$-type emitter region 29 and the $p^+$-type contact region 13 are assumed to be disposed to repeatedly alternate along the first direction X. In this case, a cross-section of the structure at cutting line B-B' and a cross-section of the structure at cutting line C-C' in FIG. 2 are disposed to repeatedly alternate along the first direction X. FIG. 3 depicts the cross-sectional structures at cutting line B-B' and cutting line C-C' in FIG. 2. Further, in FIG. 3, the carrier drawing region 5 and a MOS gate 20 of the active region 1 are depicted in a simplified manner.

Figure 4A:
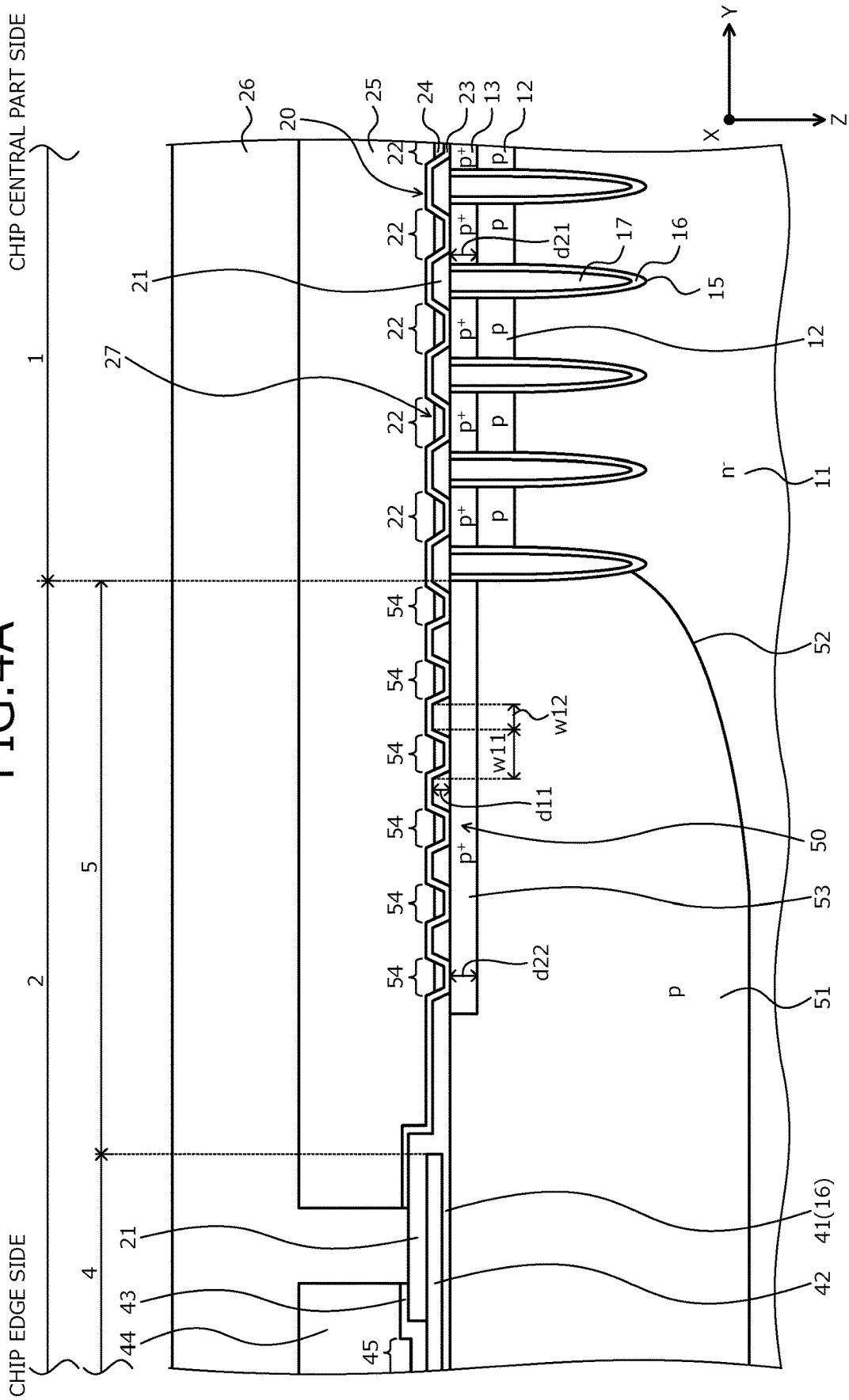
FIG. 4A is an enlarged cross-sectional view of a structure of a carrier drawing region in FIG. 3.
Figure 4B:
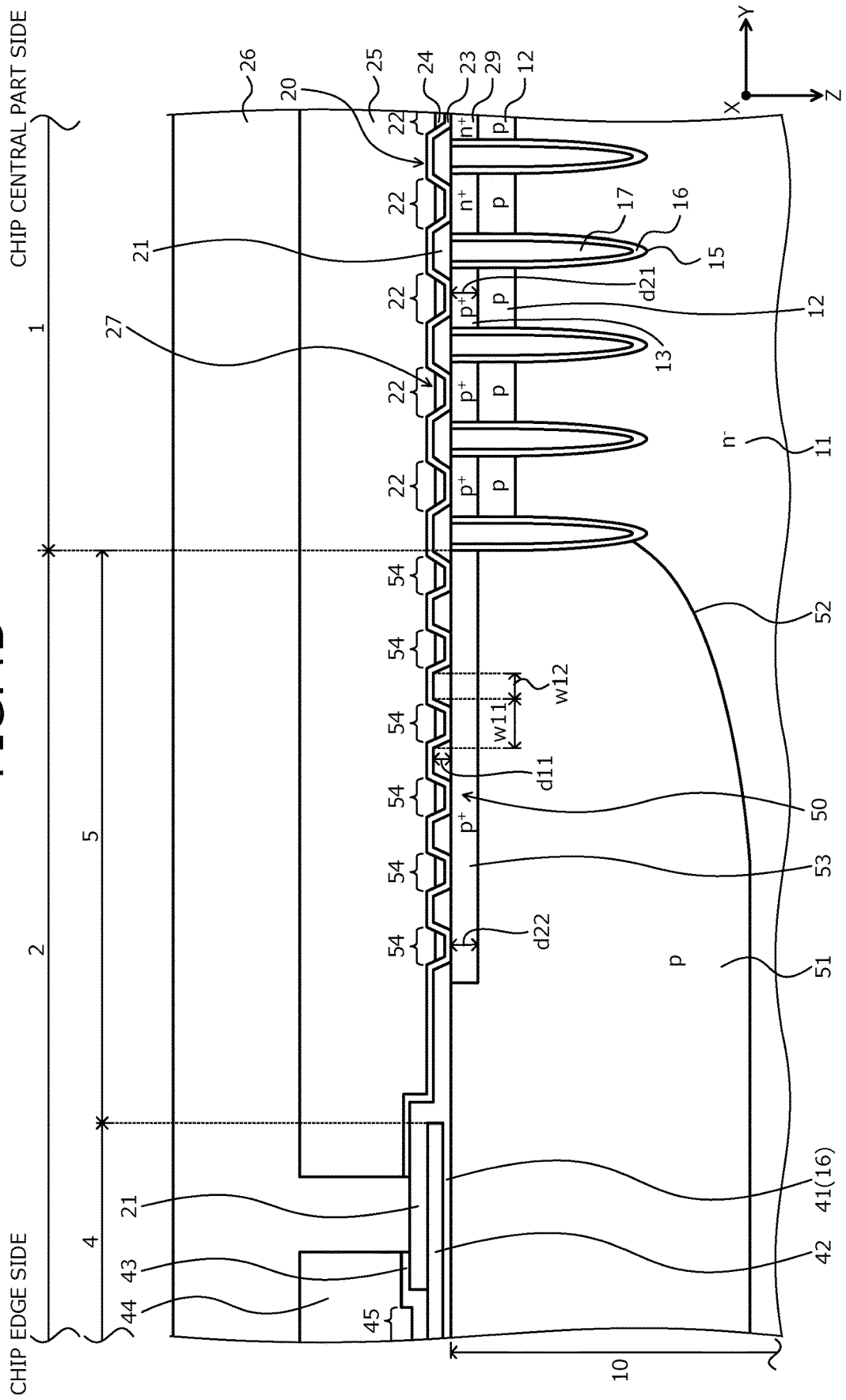
FIG. 4B is an enlarged cross-sectional view of the structure of the carrier drawing region in FIG. 3.

FIGS. 4A and 4B depict an enlarged view of the carrier drawing region in FIG. 3. In other words, FIG. 4A depicts a cross-sectional view of a part of the structure at cutting line B-B' in FIG. 2 and FIG. 4B depicts a cross-sectional view of the structure at cutting line C-C' in FIG. 2. FIGS. 5 and 6 depict other cross-sectional examples of the structure at cutting line B-B' in FIG. 2. In other words, FIGS. 5 and 6 depict other examples different from the cross-sectional structure of the carrier drawing region 5 in FIG. 4A.

The semiconductor device according to the first embodiment depicted in FIGS. 1 to 3, 4A, and 4B is a vertical IGBT having the active region 1 and the edge termination region 2 in the semiconductor substrate 10 of an $n^-$-type and constituting an $n^-$-type drift region (fifth semiconductor region) 11. In the case of a 600V IGBT, a thickness t1 of the semiconductor substrate 10, for example, may be in a range from about 60 µm to 80 µm. The active region 1, for example, has a substantially rectangular planar shape and is provided at a central part of the semiconductor substrate 10. The active region 1 is a region in which main current flows when an element (IGBT) is in an ON state.

In the active region 1, the MOS gate 20 having a general trench gate structure is provided singularly or in plural on a front surface side of the semiconductor substrate 10. One unit cell (constituent unit of the element) of the IGBT is constituted by one MOS gate 20. The MOS gate 20 is constituted by a p-type base region (first semiconductor region) 12, the $n^+$-type emitter region (second semiconductor region) 29, the $p^+$-type contact region (third semiconductor region) 13, the trench 15, the gate insulating film 16, and the gate electrode 17.

The p-type base region 12 is provided in a surface layer at the front surface of the semiconductor substrate 10, spanning the active region 1 overall. A depth d1 of the p-type base region 12, for example, may be in a range from about 2 µm to 3 µm. A part of the semiconductor substrate 10 excluding the p-type base region 12, a $p^+$-type collector region 19 described hereinafter, a field limiting ring 31, and the $n^+$-type stopper region 35 is the $n^-$-type drift region 11.

The $n^+$-type emitter region 29 and the $p^+$-type contact region 13 are each selectively provided in a surface region (the surface layer at the front surface of the semiconductor substrate 10) of the p-type base region 12. Provided the $n^+$-type emitter region 29 opposes the gate electrode 17 across the gate insulating film 16 at a side wall of the trench 15, disposal of the $n^+$-type emitter region 29 may be variously changed. For example, when the trench 15 is disposed in a striped shape extending along the first direction X, the $n^+$-type emitter region 29 and the $p^+$-type contact region 13 may be disposed to repeatedly alternate along the first direction X. A part in which the $n^+$-type emitter region 29 is disposed is depicted in FIG. 4B (similarly in FIG. 17).

In the active region 1, at a part thereof near the carrier drawing region 5, the $p^+$-type contact region 13 (in FIGS. 5 and 6, the $p^+$-type contact region 13 and $p^{++}$-type surface implantation region 14) alone are provided in a surface region of the p-type base region 12 and the $n^+$-type emitter region 29 is not provided. In the active region 1, the part thereof near the carrier drawing region 5, for example, when the trenches 15 are disposed in a striped shape extending along the first direction X, is a part near each end along the first direction X, between (mesa region) adjacent trenches 15 and several mesa regions disposed along a direction (second direction Y) orthogonal to the first direction X.

In other words, when the trenches 15 are disposed in a striped shape extending along the first direction X, in several mesa regions disposed furthest outward along the second direction Y, only the $p^+$-type contact region 13 and the $p^{++}$-type surface implantation region 14 extend along the first direction X in the surface region of the p-type base region 12. In the remaining mesa regions excluding the several mesa regions disposed furthest outward along the second direction Y, in a vicinity of each end thereof along the first direction X, only the $p^+$-type contact region 13 and the $p^{++}$-type surface implantation region 14 extend along the first direction X, while in a part closer to the central part along the first direction X than are the vicinities of the ends along the first direction X, the $n^+$-type emitter region 29 is provided (FIG. 4B).

For reasons as follows, the $n^+$-type emitter region 29 is not provided in a part of the active region 1 near the carrier drawing region 5. A first reason is that when an ion implantation mask for forming the $n^+$-type emitter region 29 is formed, the ion implantation mask becomes uneven due to a poly-silicon layer such as for the gate runner 42 formed on the front surface of the semiconductor substrate 10 before the ion implantation mask. Due to the unevenness of the ion implantation mask, variation of the layout of the $n^+$-type emitter region 29 may occur at a part near the poly-silicon layer. A second reason is that a contact of a mesa region in which the $n^+$-type emitter region 29 of the active region 1 is not provided may be caused to function similarly to the contacts 50 of the carrier drawing region 5 and reduction of the breakdown voltage of the edge termination region 2 may be suppressed.

A depth d21 of the $p^+$-type contact region 13, for example, may be shallow in a range from about 0.4 µm to 0.6 µm. A reason for this is that, in general, the shallower the depth d21 of the $p^+$-type contact region 13 is, an impurity concentration of the $p^+$-type contact region 13 at a part near the front surface of the semiconductor substrate 10 shows a peak value (maximum value) and therefore, a contact resistance Rb (refer to FIG. 7 described hereinafter) of contacts 27 between a barrier metal (first metal film) 23 and the $p^+$-type contact regions 13, 61 of the active region 1 is easily reduced and secured at a predetermined resistance value.

When a depth d21' of a $p^+$-type contact region 13' exceeds 0.6 µm and, for example, is about 1.0 µm (FIG. 5), compared to a case where the depth d21' of the $p^+$-type contact region 13' is about 0.6 µm, the impurity concentration of the $p^+$-type contact region 13 shows a peak value at a deeper position from the front surface of the semiconductor substrate 10. Additionally, compared to a case where the depth d21' of the $p^+$-type contact region 13' is about 0.6 µm, the peak value of the impurity concentration of the $p^+$-type contact region 13 is lower.

In other words, when the depth d21' of the p$^+$-type contact region 13' exceeds 0.6 µm, the predetermined contact resistance Rb of the p$^+$-type contact region 13' may not be obtained. Additionally, latch-up capability of the active region 1 may decrease. Therefore, a p$^{++}$-type region (hereinafter, the p$^{++}$-type surface implantation region (seventh semiconductor region)) 14 may be provided in each part exposed in contact holes (first contact holes) 22 of the p$^+$-type contact region 13' (FIG. 5). As a result, a p-type impurity concentration of the surface region of the p$^+$-type contact region 13' may be increased.

Each p$^{++}$-type surface implantation region 14, for example, is formed as follows. In the interlayer insulating film 21, the contact hole 22 is formed penetrating the interlayer insulating film 21 in a depth direction Z and reaching the front surface of the semiconductor substrate 10. The depth direction Z is a direction from the front surface of the semiconductor substrate 10 toward a rear surface. In the surface region of the p$^+$-type contact region 13', from the contact hole 22 in the interlayer insulating film 21, for example, a p-type impurity such as difluoroboron (BF$_2$) is ion implanted at a high impurity concentration. Thereafter, the ion implanted p-type impurity, for example, is activated without substantially being diffused by heat treatment at a temperature in a range from about 600 degrees C. to 900 degrees C. Thus, in this manner, the p$^{++}$-type surface implantation region 14 of a shallow depth may be formed in the surface region of the p$^+$-type contact region 13'.

Adjacent p$^{++}$-type surface implantation regions 14 may be in contact with each other. Further, even when the depth d21 of the p$^+$-type contact region 13 is shallow at about 0.6 µm (FIG. 4), the p$^{++}$-type surface implantation region 14 may be provided in the p$^+$-type contact region 13.

Provision of the p$^{++}$-type surface implantation region 14 enables the predetermined contact resistance Rb of the contacts 27 of the MOS gates 20 in the active region 1 and a predetermined latch-up capability of the active region 1 to be secured. Instead of the p$^+$-type contact regions 13, 13', a p$^+$-type contact region 61 may be provided only in parts exposed in the contact holes 22 of the p-type base region 12 and a p$^{++}$-type surface implantation region 62 may be further provided in the p$^+$-type contact region 61 (FIG. 6).

The trenches 15 penetrate the n$^+$-type emitter region 29 and the p-type base region 12 and reach the n$^-$-type drift region 11. The trenches 15 may be provided in a striped layout that extends along a direction parallel to the front surface of the semiconductor substrate 10 (the first direction X), or may be disposed in a matrix-like layout as viewed from the front surface of the semiconductor substrate 10. The gate electrode 17 is provided in each of the trenches 15, via the gate insulating film 16. A depth d2 of the trenches 15, for example, may be in a range from about 3 µm to 8 µm.

In the n$^-$-type drift region 11, toward the p$^+$-type collector region 19, an n-type field stopper region 18 may be provided spanning the active region 1 and the edge termination region 2. The n-type field stopper region 18 has a function of suppressing a depletion layer from reaching the p$^+$-type collector region 19, the depletion layer spreading from a pn junction of the p-type base region 12 and the n$^-$-type drift region 11 toward the p$^+$-type collector region 19 when the IGBT is OFF.

The n-type field stopper region 18 may be disposed at a position deeper from the rear surface of the semiconductor substrate 10 than is the p$^+$-type collector region 19, and may be in contact with the p$^+$-type collector region 19. Further, the n-type field stopper region 18 may be disposed in plural at differing depths from the rear surface of the semiconductor substrate 10. In FIG. 3, a case is depicted in which one n-type field stopper region 18 is disposed deeply from the rear surface of the semiconductor substrate 10.

The interlayer insulating film 21 is provided at the front surface of the semiconductor substrate 10 overall so as to cover the gate electrode 17, the gate runner 42 described hereinafter and a poly-silicon electrode 33. In the interlayer insulating film 21, the contact holes 22 exposing the n$^+$-type emitter region 29 and the p$^+$-type contact region 13 are provided. The contact holes 22 may be provided slightly removing a semiconductor part (silicon (Si) part, i.e., the semiconductor substrate 10) and thereby protruding from an interface of the interlayer insulating film 21 and the semiconductor substrate 10 toward the semiconductor substrate 10.

From a surface of the interlayer insulating film 21, along inner walls (side surface of the interlayer insulating film 21 and the front surface of the semiconductor substrate 10) of the contact holes 22, a barrier metal 23 is provided. The barrier metal 23 is made of a metal having high adhesiveness with the semiconductor part and forming an ohmic contact with the semiconductor part. In particular, the barrier metal 23, for example, may be a titanium (Ti) film, or a metal stacked film in which a titanium film and a titanium nitride (TiN) film are sequentially stacked.

On the barrier metal 23, a contact plug (second metal film) 24 is provided so as to be embedded in each contact hole 2. The contact plug 24, for example, may be a metal film that uses tungsten (W), which has a high embedding property, as a material. An emitter electrode 25 is provided in the active region 1, at the front surface of the semiconductor substrate 10 overall. The emitter electrode 25 is electrically connected with the n$^+$-type emitter region 29 and the p$^+$-type contact region 13, via the contact plugs 24 and the barrier metal 23, and is electrically connected with the p-type base region 12, via the p$^+$-type contact region 13.

In this manner, an electrode structure is achieved in which the emitter electrode 25 and the semiconductor parts are electrically connected via the barrier metal 23 and the contacts plugs 24 embedded in the contact holes 22, whereby trench pitch (interval at which the trenches 15 are disposed) may be reduced. Further, as described hereinafter, the emitter electrode 25 extends into the carrier drawing region 5. The emitter electrode 25 is electrically insulated from the gate electrode 17 by the interlayer insulating film 21.

The emitter electrode 25 is, for example, an aluminum-silicon (Al—Si) electrode having aluminum as a main material. In a surface layer on the rear surface of the semiconductor substrate 10, the p$^+$-type collector region 19 is provided having a uniform thickness spanning the active region 1 and the edge termination region 2. A collector electrode (second electrode) 28 is provided at the entire rear surface of the semiconductor substrate 10 and is electrically connected with the p$^+$-type collector regions 19.

The edge termination region 2 is a region between the active region 1 and a side surface (chip edge) of the semiconductor substrate 10 and is disposed surrounding a periphery of the active region 1. The edge termination region 2 adjusts electric field so that a depletion layer spreading from the active region 1 to the edge termination region 2 expands. The edge termination region 2 further sustains the breakdown voltage of the element overall. The breakdown voltage is voltage when avalanche current flows. A width w1 of the edge termination region 2, for example, may be in a range from about 200 µm to 300 µm.

In the edge termination region 2, a breakdown voltage structure 30 is provided. Herein, while a case in which the field limiting ring 31, a field plate 32, the n$^+$-type stopper region 35, and a stopper electrode 37 are provided as the breakdown voltage structure 30 is described as an example, without limitation hereto, the breakdown voltage structure 30 may be variously changed according to design conditions. Hereinafter, in the edge termination region 2, a part thereof where the breakdown voltage structure 30 is disposed is regarded as the breakdown voltage structure part 3.

The breakdown voltage structure part 3 is a region from an outer end (end nearest the chip edge) of a p-type well region (fourth semiconductor region) 51 described hereinafter, to the chip edge. The field limiting ring 31 is a floating (floating electric potential) p-type region provided in plural in the breakdown voltage structure part 3; the field limiting rings 31 are provided in the surface layer at the front surface of the semiconductor substrate 10, separated from each other. The field limiting rings 31 are provided separated from the p-type well region 51 and surround a periphery of the p-type well region 51 in a substantially rectangular shape along an outer periphery of the p-type well region 51.

Further, in the breakdown voltage structure part 3, in the surface layer at the front surface of the semiconductor substrate 10, the n$^+$-type stopper region 35 is selectively provided closer to the chip edge than is the field limiting rings 31 and is separated from the field limiting rings 31. The n$^+$-type stopper region 35 surrounds the field limiting rings 31 in a substantially rectangular shape along an outer periphery of the field limiting ring 31 that is substantially outermost. The n$^+$-type stopper region 35 is exposed at the chip edge.

On each of the field limiting rings 31, for example, the poly-silicon (poly-Si) electrode 33 may be provided separated from each other. The poly-silicon electrodes 33, for example, may be formed by leaving a part of a poly-silicon layer that is deposited on the semiconductor substrate 10 to form the gate runner 42. The poly-silicon electrodes 33 and the n$^+$-type stopper region 35 are each covered by the interlayer insulating film 21 and a part thereof is exposed by contact holes provided in the interlayer insulating film 21.

In the breakdown voltage structure part 3, in each of the contact holes of the interlayer insulating film 21, for example, similarly to the barrier metal 23 and the contact plugs 24 in the active region 1, a barrier metal and a contact plug may be provided (the barrier metal and the contact plug are collectively indicated by reference numeral 34). The barrier metal and contact plugs of the breakdown voltage structure part 3, for example, may each be formed concurrently with the barrier metal 23 and the contact plug 24 of the active region 1.

The field plate 32, which is a floating metal film, is electrically connected with each of the field limiting rings 31, for example, via the poly-silicon electrode 33, the barrier metal, and the contact plugs. Each of the field plates 32 surrounds a periphery of the p-type well region 51 in a substantially rectangular shape along the field limiting ring 31 to which the field plate 32 is electrically connected.

The stopper electrode 37 is electrically connected with the n$^+$-type stopper region 35, via a barrier metal and a contact plug (the barrier metal and the contact plug are collectively indicated by reference numeral 36). The stopper electrode 37 is provided separated from the field plate 32 and is fixed at an electric potential of the collector electrode 28. Similarly to the n$^+$-type stopper region 35, the stopper electrode 37 surrounds, in a substantially rectangular shape, a periphery of the field limiting ring 31 that is outermost.

Between the active region 1 and the breakdown voltage structure part 3, for example, the gate runner 42 made of a poly-silicon is provided on the front surface of the semiconductor substrate 10, via an insulating layer 41. The gate electrodes 17 of all of the MOS gates 20 are electrically connected with the gate runner 42. Hereinafter, a part of the edge termination region 2 where the gate runner 42 is disposed is regarded as the gate runner part 4. The gate runner part 4 is a region from an end of the gate runner 42 (the end thereof nearest the active region 1) to an end of the p-type well region 51 (the end thereof nearest the chip end).

The gate runner 42 is electrically insulated from the semiconductor substrate 10 by the insulating layer 41. For example, at the time of formation of the gate insulating film 16 of the MOS gates 20, the gate insulating film 16 may be partially left in the gate runner part 4 as the insulating layer 41. The gate runner 42 surrounds a periphery of the active region 1 in a substantially rectangular shape along an outer periphery of the active region 1. The gate runner 42 is electrically insulated from the barrier metal 23, the contact plug 24 and the emitter electrode 25 of the active region 1 by the interlayer insulating film 21.

Further, the gate runner 42 is exposed in a contact hole 45 provided in the interlayer insulating film 21 of the gate runner part 4. In the contact hole 45 that exposes the gate runner 42, for example, similarly to the barrier metal 23 and the contact plugs 24 of the active region 1, a barrier metal and a contact plug may be provided (the barrier metal and the contact plug are collectively indicated by reference numeral 43). The barrier metal and contact plug of the gate runner part 4, for example, may each be formed concurrently with the barrier metal 23 and the contact plugs 24 of the active region 1.

A gate metal wiring 44 of the gate potential is electrically connected with the gate runner 42, via the barrier metal and the contact plug (layer indicated by reference numeral 43). The gate metal wiring 44 is provided separated from the emitter electrode 25. In FIG. 3, while a case is depicted in which the gate metal wiring 44 is disposed so that the gate runner 42 is electrically connected with the gate runner part 4, disposal of the gate metal wiring 44 may be variously changed. For example, while not depicted in FIG. 1, the gate metal wiring 44 may be disposed to surround a periphery of the active region 1.

Further, the gate runner 42, at a non-depicted part, is electrically connected with a gate pad 46 (not depicted in FIG. 3) of the gate potential. The gate pad 46, for example, has a substantially rectangular planar shape and is disposed separated from the emitter electrode 25 (FIG. 1). In FIG. 1, the emitter electrode 25 is not depicted. Further, in FIG. 1, while a case is depicted in which the gate pad 46 is disposed across the carrier drawing region 5, from within the active region 1, the gate pad 46, for example, may be disposed at a center of the active region 1 or an end of the active region 1, or may be disposed at a corner part of the active region 1.

Spanning from a boundary of the breakdown voltage structure part 3 and the gate runner part 4 to the boundary of the active region 1 and the edge termination region 2, the p-type well region 51 is provided in the surface layer at the front surface of the semiconductor substrate 10. The p-type well region 51 may be in contact with a side wall furthest outward of the trench 15 disposed furthest outward in the active region 1. Further, the p-type well region 51 may be in contact with the side wall furthest outward of the trench 15 disposed furthest outward in the active region 1 and may be provided between the trench disposed furthest outward and the trench 15 adjacent thereto. The p-type well region 51 surrounds a periphery of the active region 1 in a substantially rectangular shape along an outer periphery of the active region 1. A pn junction of the p-type well region 51 and the n$^-$-type drift region 11 is a main junction part 52 that transmits voltage at the time of turn OFF of the IGBT, from the active region 1 to the edge termination region 2.

A depth d3 of the p-type well region 51 is deeper than the depth d1 of the p-type base region 12. Further, the depth d3 of the p-type well region 51 may be deeper than the depth d2 of the trenches 15. In particular, the depth d3 of the p-type well region 51 may be the deepest part and, for example, may be at least 3 µm. A reason for this is that when the present invention is applied to two IGBTs constituting a bridge circuit and an inductive load (L load) of a motor, etc. is moved by alternately turning ON and OFF the two IGBTs, a concentration of current at the carrier drawing region 5 described hereinafter due to an inductance component of the inductive load (L load) may be suppressed.

In a surface region (the surface layer at the front surface of the semiconductor substrate 10) of the p-type well region 51, spanning substantially an entire surface between the active region 1 and the gate runner part 4, a p$^+$-type contact region 53 is provided (refer to FIGS. 4A and 4B). The p$^+$-type contact region 53 is in contact with the side wall furthest outward of the trench 15 disposed furthest outward in the active region 1. The p$^+$-type contact region 53 surrounds a periphery of the active region 1 in a substantially rectangular shape (not depicted). A depth d22 of the p$^+$-type contact region 53, for example, may be shallow in a range from about 0.4 µm to 0.6 µm. A reason for this is as follows.

The p$^+$-type contact region 53, for example, is formed concurrently with the p$^+$-type contact region 13 of the active region 1. In this case, the depth d22 of the p$^+$-type contact region 53 becomes substantially equal to the depth d21 of the p$^+$-type contact region 13 of the active region 1. Therefore, when the depth d22 of the p$^+$-type contact region 53 exceeds 0.6 µm, the depth d21 of the p$^+$-type contact region 13 of the active region 1 also exceeds 0.6 µm. As a result, when the depth of the p$^+$-type contact region 13 of the active region 1 is shallow according to the depth of the p$^+$-type contact region 53, the drawing out of the hole current in the p$^+$-type contact region 13 of the active region 1 weakens, whereby the described latch-up capability of the active region 1 may decrease.

Further, in the p$^+$-type contact region 53, the p$^{++}$-type surface implantation region is not provided. In other words, even when the depth d21' of the p$^+$-type contact region 13' of the active region exceeds 0.6 µm, whereby also in a case where a depth d22' of a p$^+$-type contact region 53' exceeds 0.6 µm (FIG. 5), the p$^{++}$-type surface implantation region 14 is provided only in the p$^+$-type contact region 13' of the active region 1. Therefore, a surface depth concentration at the depth d22' of the p$^+$-type contact region 53' decreases, whereby the resistance of the p$^+$-type contact region 13' increases and the latch-up capability decreases. However, by further forming the p$^{++}$-type surface implantation region 14 in the surface, contact resistance with the p$^+$-type contact region 13' decreases and the latch-up capability may be secured. On the other hand, as described hereinafter, with disposal of the p$^{++}$-type surface implantation region 14 at the contacts 50 of the carrier drawing region 5, a contact resistance Ra can be made higher than the contact resistance Rb.

Instead of the p$^+$-type contact regions 53, 53', a p$^+$-type contact region 63 may be provided only in parts exposed by contact holes (second contact holes) 54 described hereinafter of the p-type well region 51 (FIG. 6).

In a part of the interlayer insulating film 21 opposing the p$^+$-type contact region 53 along the depth direction Z, the contact holes 54 are provided that selectively expose the p$^+$-type contact region 53. The contact holes 54 each penetrates the interlayer insulating film 21 in the depth direction Z and reaches the front surface of the semiconductor substrate 10. The contact holes 54 are disposed in a striped layout extending along an outer periphery of the active region 1 and surround a periphery of the active region 1 in a substantially rectangular shape along an outer periphery of the active region 1.

Along an inner wall of each of the contact holes 54, similarly to the active region 1, the barrier metal 23 is provided extending from the active region 1. Further, in each of the contact holes 54, similarly to the active region 1, the contact plugs 24 are provided on the barrier metal 23. The barrier metal 23 and the contact plugs 24 in the contact holes 54 are each, for example, formed concurrently with the barrier metal 23 and the contact plugs 24 of the active region 1. Dimensions of the contact holes 54 may be equal to those of the contact holes 22 of the active region 1.

In particular, a depth d11 of the contact holes 54, for example, may be in a range from about 0.5 µm to 1 µm. A width w11 of the contact holes 54, for example, is at least 0.3 µm, which is the minimum value of the processing limit of etching, and at most about 1.0 µm, which enables substantially complete embedding of the contact plugs 24 in the contact holes 54. A width w12 between adjacent the contact holes 54 may be at least the width w11 of the contact holes 54, and further may be substantially equal to the width w11 of the contact holes 54.

The contact holes 54 may have a substantially rectangular cross-sectional shape having a side wall that is substantially orthogonal to the front surface of the semiconductor substrate 10. Further, the contact holes 54 may have a side wall that is inclined by a predetermined angle with respect to the front surface of the semiconductor substrate 10 and may have a substantially tapered cross-sectional shape having a bottom of a narrower width than is an opening width of an interface side with the emitter electrode 25. When the contact holes 54 have a substantially tapered cross-sectional shape, the width w11 of the contact holes 54 is the opening width of the interface side with the emitter electrode 25.

Due to a reaction of silicon in the p-type well region 51 (the p$^+$-type contact region 53) and titanium in the barrier metal 23, a titanium silicide (TiSi$_2$) film is generated between the p$^+$-type contact region 53 and the barrier metal 23. In other words, in each of the contact holes 54, the contact 50 having an ohmic property between the p$^+$-type contact region 53 and the barrier metal 23 is formed. Hereinafter, a part of the edge termination region 2 in which the contacts 50 are disposed is regarded as the carrier drawing region 5.

The carrier drawing region 5 is a region between the active region 1 and the gate runner part 4. The emitter electrode 25 extends outwardly (e.g., onto the interlayer insulating film 21 of the gate runner part 4) from the active region 1 and is embedded in all of the contact holes 54 of the carrier drawing region 5. The emitter electrode 25 is electrically connected with the contact plugs 24 and the barrier metal 23 in the contact holes 54 of the carrier drawing region 5 and with the p$^+$-type contact region 53, via the p-type well region 51.

Each of the contacts 50 (the contact holes 54) of the carrier drawing region 5 surround a periphery of the active region 1 in a substantially rectangular shape along an outer periphery of the active region 1. The contacts 50 of the carrier drawing region 5 have a function of drawing out holes to the emitter electrode 25, the holes being minority carriers generated in the edge termination region 2 at the time of turn OFF of the IGBT. In the edge termination region 2, the contacts 50 for drawing out holes from the p-type well region 51 to the emitter electrode 25 are provided in the p-type well region 51 forming the main junction part 52, whereby a concentration of current at the carrier drawing region 5 in the edge termination region 2 may be suppressed.

The contact resistance Ra the contacts 50 of the carrier drawing region 5 (refer to FIG. 7 described hereinafter) is higher than the contact resistance Ra' of the contact 150 of the carrier drawing region 105 of the conventional structure (refer to FIGS. 10 and 11) (Ra>Ra'). A reason for this is as follows. In the conventional structure, a main material of the emitter electrode 122 constituting the contact 150 with silicon (the p-type well region 151) is aluminum. In the present invention, the contacts 50 of the carrier drawing region 5 are formed using a metal film (the barrier metal 23) containing titanium as a main material, titanium more easily increasing the contact resistance with silicon (the p-type well region 51) as compared to aluminum.

Further, in the present invention, the p-type well region 51 is partially covered by the interlayer insulating film 21, whereby the surface area is smaller than the surface area of the contact 150 of the carrier drawing region 105 of the conventional structure. As a result, the contact resistance Ra of the contacts 50 of the carrier drawing region 5 may be further increased as compared to the contact resistance Ra' of the contact 150 of the carrier drawing region 105 of the conventional structure. In particular, the contact resistance Ra of the contacts 50 of the carrier drawing region 5 may be more than 100 times the contact resistance Ra' of the contact 150 of the carrier drawing region 105 of the conventional structure (Ra>100Ra').

Further, the contact resistance Ra of the contacts 50 of the carrier drawing region 5 is higher than the contact resistance Rb of the contacts 27 of the MOS gates 20 in the active region 1 (Ra>Rb). This condition of the contact resistance Ra, as described above, is obtained by providing the $p^{++}$-type surface implantation region 14 only in the $p^+$-type contact region 13' of the active region 1, and not providing a $p^{++}$-type surface implantation region in the $p^+$-type contact region 53. Further, this condition of the contact resistance Ra is obtained by partially covering the p-type well region 51 by the interlayer insulating film 21 and adjusting the ratio of the surface area of the contacts 50 of the carrier drawing region 5 to the surface area of the contacts 27 of the MOS gates 20 in the active region 1.

In this manner, the contact resistance Ra of the contacts 50 of the carrier drawing region 5 are set, whereby as depicted in FIG. 7, at the time of turn OFF of the IGBT, a hole current 70 generated at the edge termination region 2 and flowing toward the active region 1, mainly, passes through a part (part opposing in the depth direction Z) of the $n^-$-type drift region 11 directly beneath the p-type well region 51, flows into the active region 1, and is drawn out from the contacts 27 of the MOS gates 20 toward the emitter electrode 25 (white arrow indicated by reference numeral 71). Therefore, the hole current 70 is less likely to flow into the p-type well region 51 of the carrier drawing region 5 of the high contact resistance Ra than into the active region 1 (white arrow indicated by reference numeral 72 and thinner than that indicated by reference numeral 71). Therefore, the hole current 70 may be prevented from concentrating in the p-type well region 51.

Further, the active region 1 occupies a greater area of the mathematical chip area (surface area of the semiconductor substrate 10) as compared to the edge termination region 2 and the number of the contacts 27 of the MOS gates 20 is also greater. Therefore, a hole current 72 flowing into the active region 1 is distributed to the contacts 27 and drawn to the emitter electrode 25 so as to flow in the $n^-$-type drift region 11, from beneath the p-type well region 51. As a result, the hole current 72 may be prevented from concentrating in the p-type well region 51 and a large portion of the hole current may be drawn to the contacts 27 of the active region 1, whereby self-clamping damage becomes less likely to occur and avalanche capability may be enhanced.

A width w2 of the carrier drawing region 5, for example, may be in a range from 5 μm to 100 μm. A reason for this is as follows. When the width w2 of the carrier drawing region 5 is narrow and the active region 1 is near the gate runner part 4, the hole current 72 may be further drawn to the active region. On the other hand, when the width w2 of the carrier drawing region 5 exceeds 100 μm, the flow of current to the active region 1 becomes difficult and a large portion of the hole current 72 concentrates at the contacts 27 of the p-type well region 51, destroying the element.

As described above, according to the first embodiment, the plural contact holes selectively exposing the $p^+$-type contact region in the p-type well region are formed in the carrier drawing region and plural contacts of the $p^+$-type contact region and the barrier metal containing titanium as main material are formed in the contact holes. Additionally, the $p^{++}$-type surface implantation region is provided only in the p-type base region of the active region, and the $p^{++}$-type surface implantation region is not provided in the carrier drawing region. As a result, the contact resistance of the contacts of the carrier drawing region may be made higher than the contact resistance of the contacts of the MOS gates in the active region. Therefore, the hole current that is generated in the edge termination region at the time of turn OFF of the IGBT and that flows toward the active region may be mainly drawn out from the contacts of the MOS gates in the active region toward the emitter electrode. As a result, the hole current generated in the edge termination region at the time turn OFF of the IGBT does not concentrate at the p-type well region of the carrier drawing region, enabling the avalanche capability of the edge termination region to be enhanced, whereby the overall element avalanche capability may be enhanced. Therefore, when the two IGBTs constituting the bridge circuit are both in the ON state, short-circuit current that flows in the IGBTs is blocked, and even when the IGBTs self-clamp, the IGBTs are not destroyed by the edge termination region (carrier drawing region).

Figure 8:
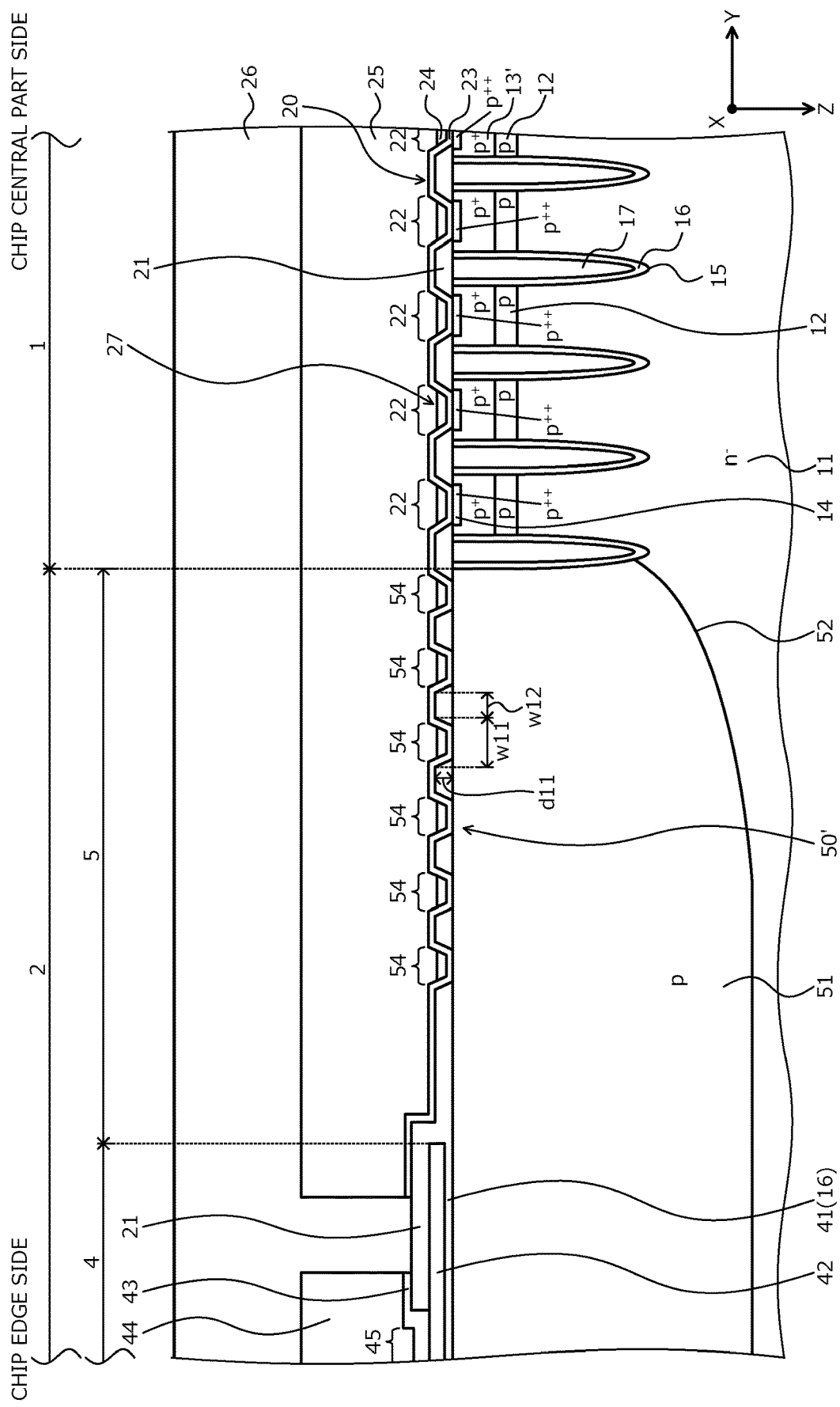
FIG. 8 is a cross-sectional view of a structure of the semiconductor device according to a second embodiment.

A structure of the semiconductor device according to a second embodiment will be described. FIG. 8 is a cross-sectional view of a structure of the semiconductor device according to the second embodiment. A layout of the active region 1, the breakdown voltage structure part 3, the gate runner part 4 and the carrier drawing region 5 as viewed from the front surface side of the semiconductor substrate 10 is similar to that in the first embodiment (FIGS. 1 and 2). Configuration of the edge termination region 2 is similar to that of the edge termination region 2 in FIG. 3. FIG. 8 is a cross-sectional view of a part of the structure at cutting line B-B' in FIG. 2 and depicts an enlarged view of the carrier drawing region 5 in FIG. 3. A cross-section of the structure at cutting line C-C' in FIG. 2 is similar to that in FIG. 4B.

The semiconductor device according to the second embodiment differs from the semiconductor device according to the first embodiment depicted in FIG. 5 in that no p$^+$-type contact region is provided in the p-type well region 51 of the edge termination region 2. In other words, the p$^+$-type contact region 13' is provided only in the p-type base region 12 of the active region 1. The p$^{++}$-type surface implantation region 14 may be provided in the p$^+$-type contact region 13'. The contacts 50 of the carrier drawing region 5' are formed by the p-type well region 51 and the barrier metal 23 in the contact holes 54.

A configuration in which no p$^+$-type contact region is provided in the p-type well region 51 of the edge termination region 2 such as in the second embodiment may be applied to the semiconductor device according to the first embodiment depicted in FIGS. 4A, 4B, and 6.

As described above, according to the second embodiment, effects similar to those of the first embodiment may be obtained. Further, according to the second embodiment, since no p$^+$-type contact region is provided in the p-type well region of the carrier drawing region, even when the p$^+$-type contact region is provided in the p-type well region of the carrier drawing region, the contact resistance of the contacts of the carrier drawing region may be increased. Therefore, a concentration of current at the carrier drawing region due to hole current may be suppressed and the avalanche capability may be enhanced.

Figure 9:
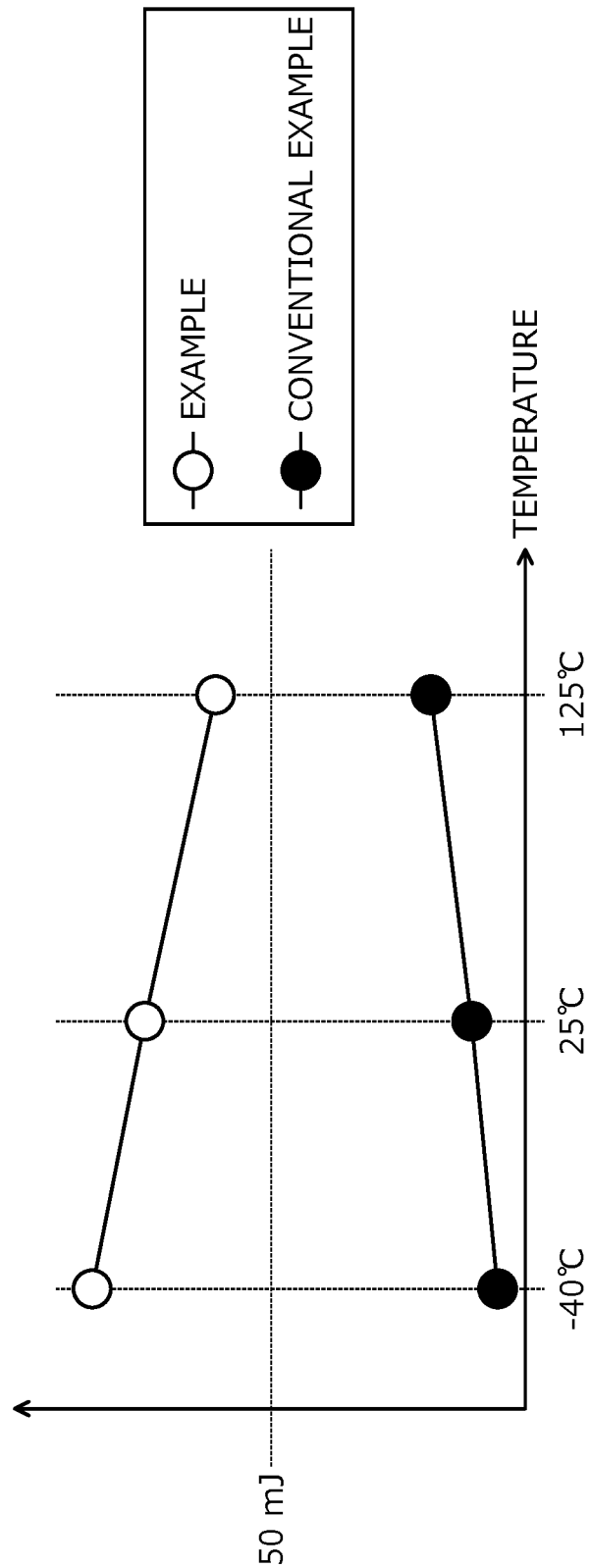
FIG. 9 is a characteristics diagram depicting a relationship between temperature and avalanche capability.

Avalanche capability of the semiconductor device according to the embodiments described was verified. FIG. 9 is a characteristics diagram depicting a relationship between temperature and avalanche capability. In FIG. 9, a horizontal axis represents junction temperature Tj of an EXAMPLE (IGBT) and a vertical axis represents avalanche energy generated in the EXAMPLE.

In a trench gate type IGBT (hereinafter, EXAMPLE) having the structure of the semiconductor device according to the embodiments described, the junction temperature Tj of the pn junction of the p-type base region 12 and the n$^-$-type drift region 11 was varied in a range of −40 degrees C., 25 degrees C., 125 degrees C., and measurement results of avalanche capability (permissible avalanche energy [mJ]) are depicted in FIG. 9. In FIG. 9, avalanche capability of a conventional trench gate type IGBT (hereinafter, conventional example: refer to FIGS. 10 to 12, 19) is further depicted.

From the results of the EXAMPLE depicted in FIG. 9, it was confirmed that in a range from −40 degrees C. to 125 degrees C. of the junction temperature Tj, in the conventional example, for example, an avalanche energy value below 50 mJ may be raised higher than 50 mJ by the structure of the present invention and the avalanche capability was significantly enhanced.

Figure 13:
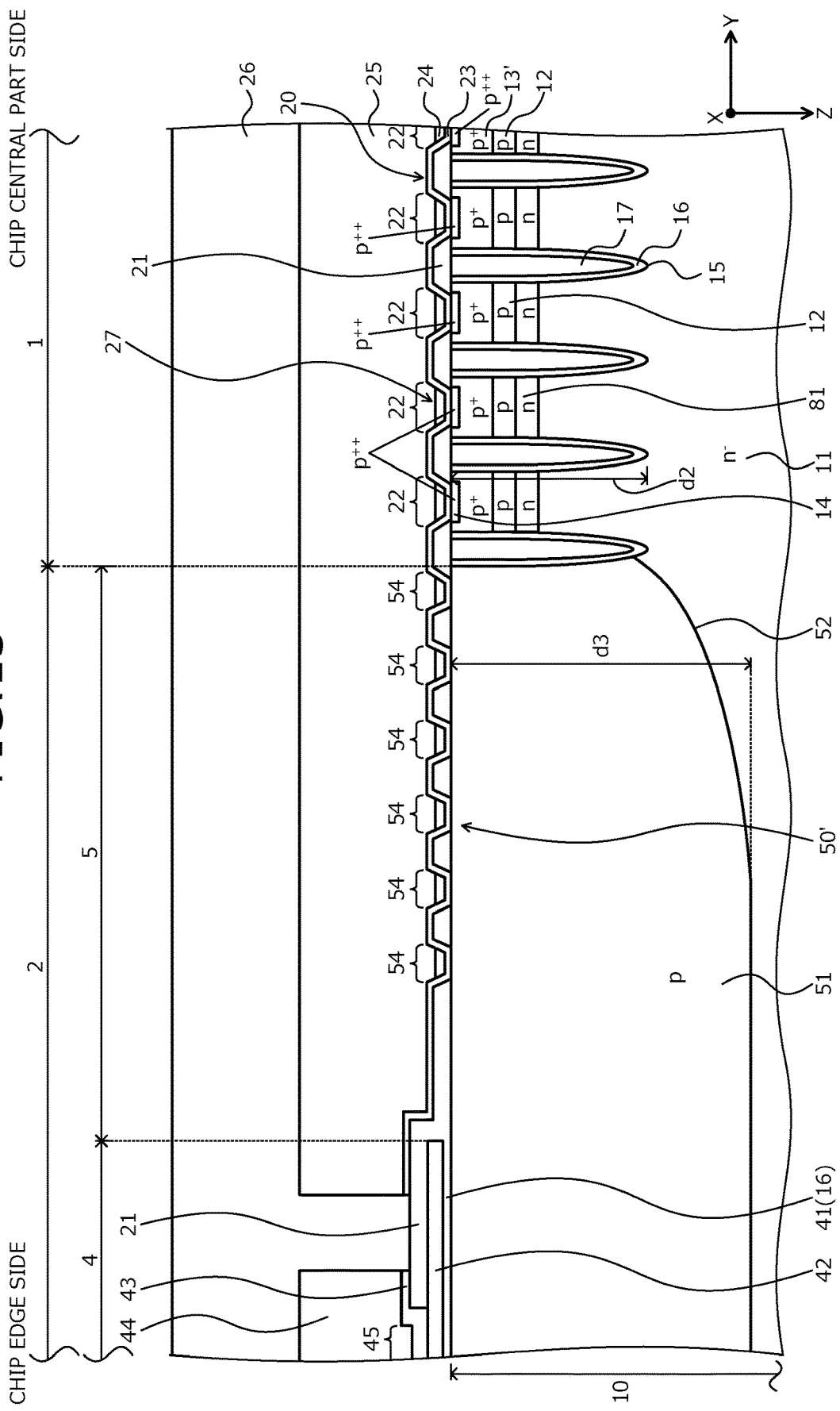
FIG. 13 is a cross-sectional view of a structure of the semiconductor device according to a third embodiment.

A structure of the semiconductor device according to a third embodiment will be described. FIG. 13 is a cross-sectional view of a structure of the semiconductor device according to the third embodiment. A layout of the active region 1, the breakdown voltage structure part 3, the gate runner part 4, and the carrier drawing region 5 as viewed from the front surface side of the semiconductor substrate 10 is similar to that in the first embodiment (FIGS. 1 and 2). Configuration of the edge termination region 2 is similar to that of the edge termination region 2 in FIG. 3. FIG. 13 is a cross-sectional view of a part of the structure at cutting line B-B' in FIG. 2 and depicts the structure near a boundary of the active region 1 and the carrier drawing region 5. A cross-section of the structure at cutting line C-C' in FIG. 2 is similar to that depicted in FIG. 4B with an addition of an n-type carrier storage region 81 described hereinafter.

The semiconductor device according to the third embodiment differs from the semiconductor device according to the second embodiment in that the n-type carrier storage region 81 having an impurity concentration higher than that of the n$^-$-type drift region 11 is provided in the active region 1. The n-type carrier storage region 81, at a depth deeper from the front surface of the semiconductor substrate 10 than is the p-type base region 12 and at a position shallower from the front surface of the semiconductor substrate 10 than are the bottoms of the trenches 15, is disposed in contact with the p-type base region 12.

In particular, the n-type carrier storage region 81 is provided between the n$^-$-type drift region 11 and the p-type base region 12, in a mesa region between adjacent trenches 15. The n-type carrier storage region 81 extends along the second direction Y and reaches both adjacent trenches 15 that sandwich the n-type carrier storage region 81. The n-type carrier storage region 81, for example, is provided in all of the mesa regions.

Further, the n-type carrier storage region 81 extends closer to the chip edge than does the n$^+$-type emitter region 29 along the first direction X in which the trenches 15 extend in a striped shape, and the n-type carrier storage region 81 terminates closer to the central part than does the p-type well region 51 of the carrier drawing region 5. In other words, the n-type carrier storage region 81 is not in contact with the p-type well region 51. In the third embodiment, the depth d3 of the p-type well region 51 is deeper than the depth d2 of the trenches 15.

The n-type carrier storage region 81 is disposed beneath the p-type base region 12, enabling the hole density near the boundary of the n$^-$-type drift region 11 with the p-type base region 12 at the time of IGBT operation to be increased. As a result, the ON voltage of the IGBT may be reduced. The n-type carrier storage region 81 may have a 2-layer structure in which two n-type regions that are in contact with each other and have differing impurity concentrations are disposed opposing each other along the depth direction Z.

While not particularly limited hereto, impurity concentrations of regions of the semiconductor device according to the third embodiment have the following values. The impurity concentration of the n$^-$-type drift region 11 is about $1\times10^{14}/cm^3$ or less. For example, when the breakdown voltage is 700V to 750V, the impurity concentration of the n$^-$-type drift region 11 is about $1\times10^{14}/cm^3$. An impurity concentration of the p-type base region 12 is about $1\times10^{17}/cm^3$. An impurity concentration of the p-type well region 51 of the carrier drawing region 5 is in a range from about $1\times10^{18}/cm^3$ to $1\times10^{19}/cm^3$. An impurity concentration of the n-type carrier storage region 81 is about $1\times10^{16}/cm^3$.

As described, according to the third embodiment, even when the n-type carrier storage region is provided in the active region, effects similar to those of the first embodiment may be obtained. Further, according to the third embodiment, the ON voltage of the IGBT may be reduced by the n-type carrier storage region of the active region.

Figure 14:
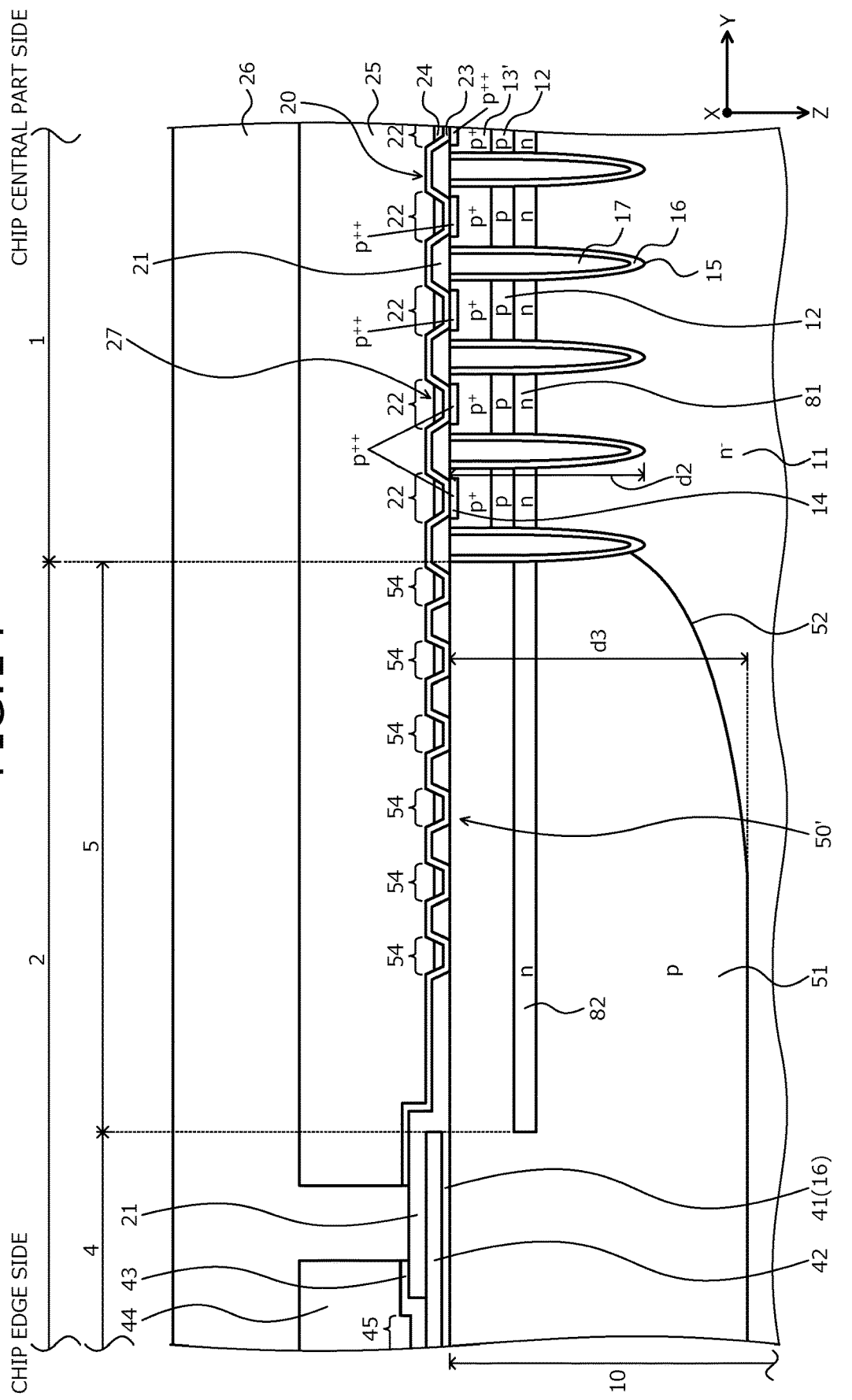
FIG. 14 is a cross-sectional view of a structure of the semiconductor device according to a fourth embodiment.
Figure 15:
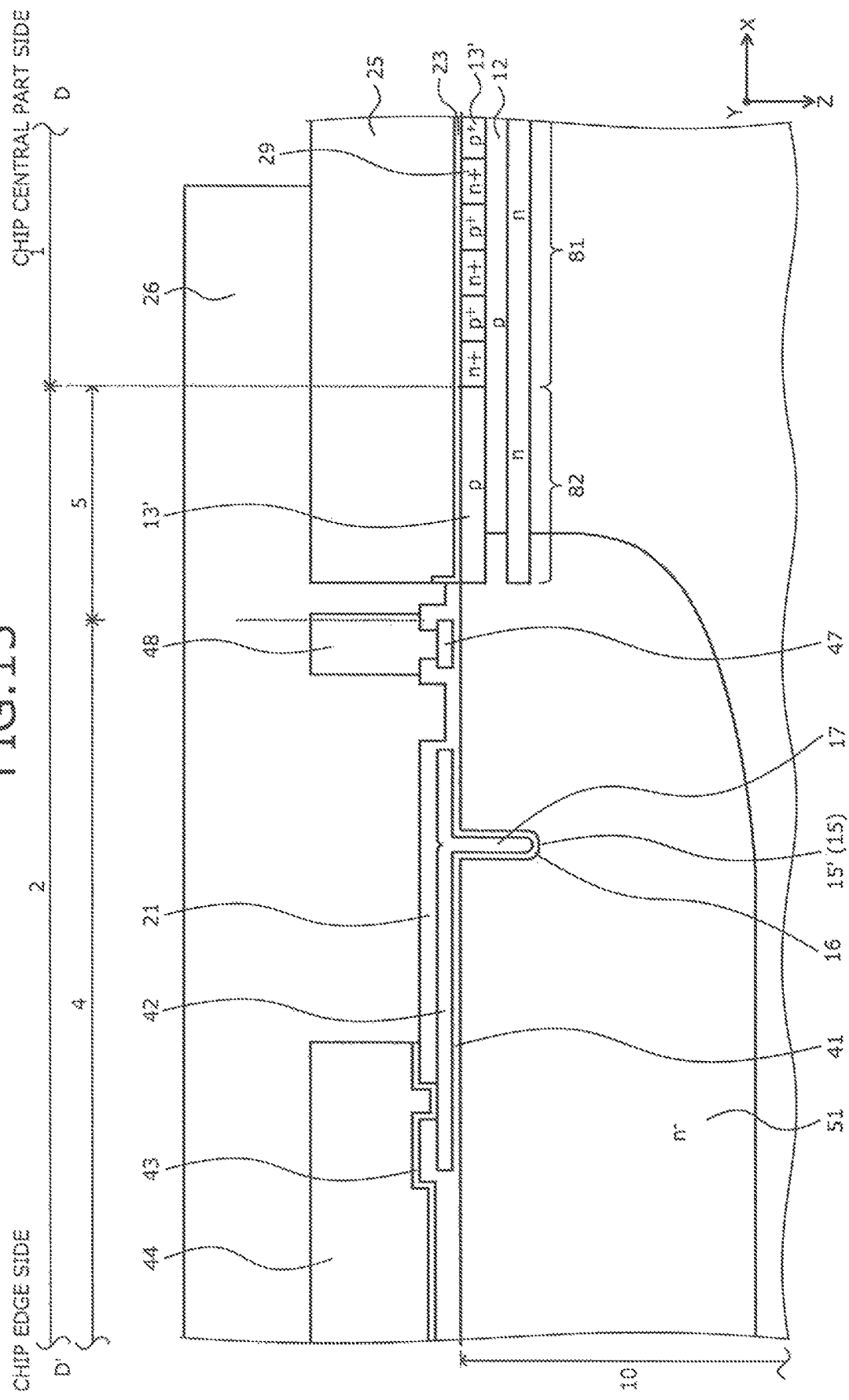
FIG. 15 is a cross-sectional view of the structure of the semiconductor device according to the fourth embodiment.
Figure 16:
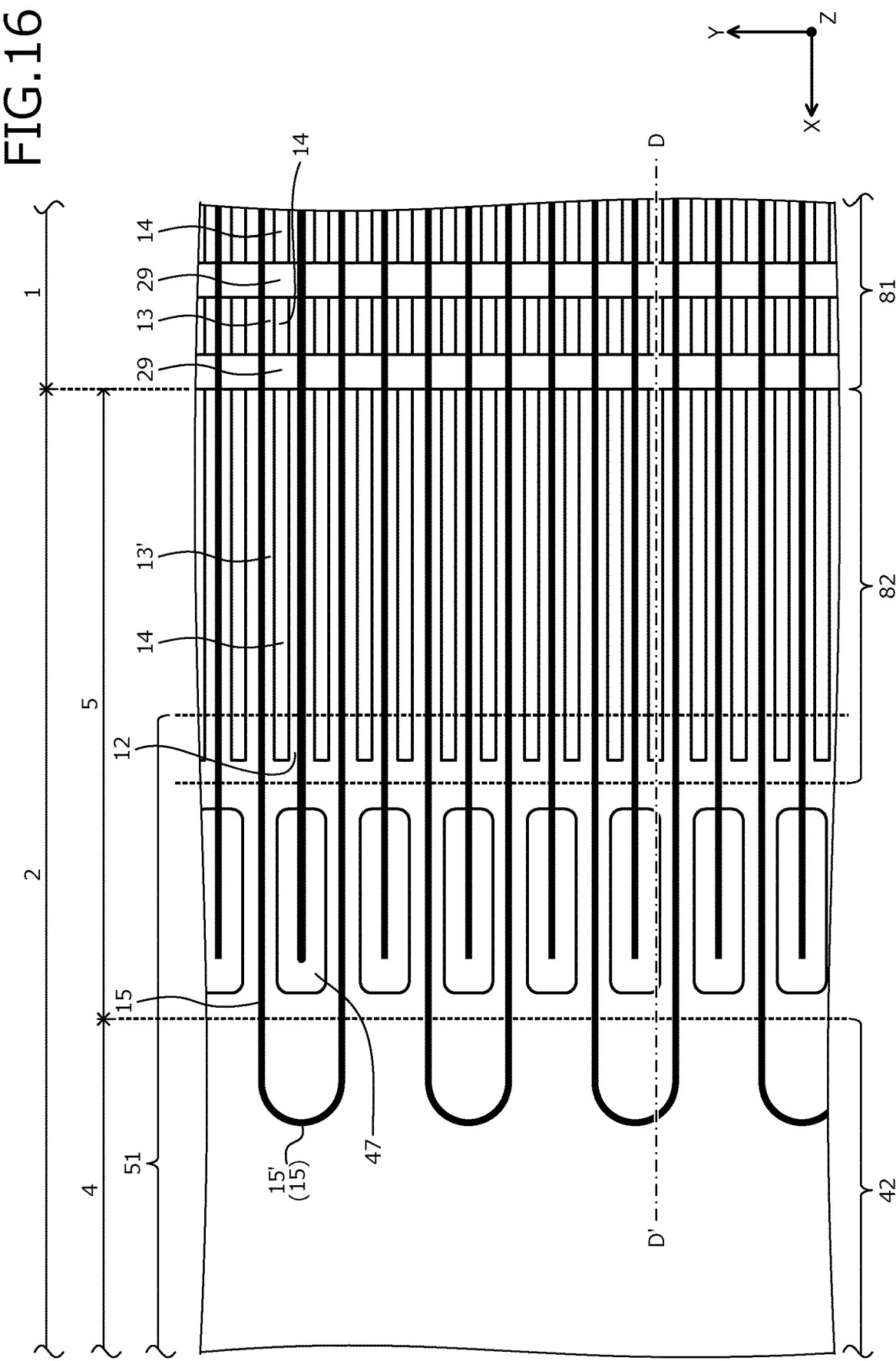
FIG. 16 is a plan view of the semiconductor device according to the fourth embodiment as viewed from the front surface side of the semiconductor substrate.

A structure of the semiconductor device according to a fourth embodiment will be described taking, as an example, a case in which the trenches 15 are disposed in a striped shape extending along the first direction X. FIGS. 14 and 15 are cross-sectional views of a structure of the semiconductor device according to the fourth embodiment. FIG. 16 is a plan view of the semiconductor device according to the fourth embodiment as viewed from the front surface side of the semiconductor substrate.

A layout of the active region 1, the breakdown voltage structure part 3, the gate runner part 4, and the carrier drawing region 5 as viewed from the front surface side of the semiconductor substrate 10 is similar to that in the first embodiment (FIGS. 1 and 2). Configuration of the edge termination region 2 is similar to that depicted in FIG. 3 with an addition of a second n-type carrier storage region 82 in the edge termination region 2 as described hereinafter. In the fourth embodiment, an enlarged view of a rectangular frame A in FIG. 1 is depicted in FIG. 2 and an enlarged view of a rectangular frame A' in FIG. 1 is depicted in FIG. 16.

The rectangular frame A in FIG. 1 is a part where the active region 1 and the edge termination region 2 are adjacent to each other along the second direction Y, in the edge termination region 2 that surrounds a periphery of the active region 1. The rectangular frame A' in FIG. 1 is a part where the active region 1 and the edge termination region 2 are adjacent to each other along the first direction X, in the edge termination region 2 that surrounds a periphery of the active region 1. FIG. 16 depicts a part spanning the gate runner part 4 from near the boundary of the active region 1 and the edge termination region 2.

FIG. 14 is a cross-sectional view of a part of the structure along cutting line B-B' in FIG. 2 and depicts the structure near the boundary of the active region 1 and the carrier drawing region 5. A cross-section at cutting line C-C' in FIG. 2 is similar to that depicted in FIG. 4B with an addition of the n-type carrier storage region 81 similarly to the third embodiment and an addition of the second n-type carrier storage region 82 described hereinafter. FIG. 15 is a cross-sectional view at cutting line D-D' in FIG. 16. In FIG. 15, gate electrodes 17 are provided in a connecting part 15' of the ends of the trenches 15.

The semiconductor device according to the fourth embodiment differs from the semiconductor device according to the third embodiment in that the second n-type carrier storage region 82 is provided not only in the active region 1, but also in the p-type well region 51 of the carrier drawing region 5. The second n-type carrier storage region 82 extends an inside of the p-type well region 51 of the carrier drawing region 5 toward the chip edge from the central part in a direction parallel to the front surface of the semiconductor substrate 10 (the first and second directions X, Y).

An end of the second n-type carrier storage region 82 toward the central part is positioned at the boundary of the active region 1 and the edge termination region 2 and is in contact with the side wall furthest outward of the trench 15 disposed furthest outward along the second direction Y. An end of the second n-type carrier storage region 82 toward the chip edge terminates at a position not opposing the gate runner 42 in the depth direction Z. The end of the second n-type carrier storage region 82 toward the chip edge may extend to a boundary of the gate runner part 4 and the carrier drawing region 5.

In other words, the second n-type carrier storage region 82 is disposed between the active region 1 and the gate runner part 4. The second n-type carrier storage region 82 is disposed separated from the contacts 50 of the carrier drawing region 5 and opposes the contacts 50 in the depth direction. The second n-type carrier storage region 82 separates the p-type well region 51 into an emitter side part and a collector side part, in the carrier drawing region 5.

For example, when ends of the trenches 15 are connected forming a U-shape or a ring-shape, the trenches 15 are extended to the gate runner part 4 and the connecting parts 15' of the ends of the trenches 15 are disposed in the gate runner part 4. As a result, the end of the second n-type carrier storage region 82 toward the chip edge may be extended, along the first direction X, to the boundary of the gate runner part 4 and the carrier drawing region 5 (FIGS. 15 and 16).

In this case, the connecting parts 15' overall of the ends of the trenches 15 are covered by the p-type well region 51 of the carrier drawing region 5. The p$^{++}$-type surface implantation regions 14 and the p$^{+}$-type contact regions 13' of the MOS gates are extended along the first direction X, to inside the carrier drawing region 5. Additionally, in the carrier drawing region 5, the end of the p-type well region 51 toward the central part may be positioned closer to the chip edge along the first direction X, than is the boundary of the active region 1 and the carrier drawing region 5 (FIG. 16).

In FIG. 16, of the trenches 15 adjacent along the second direction Y, the ends of every other trench 15 are connected, and between the trenches 15 whose ends are connected, a trench 15 whose end is not connected is disposed. The trenches 15 whose ends are connected are electrically connected with the gate metal wiring 44 by the connecting part 15', via the gate runner 42. The trench 15 whose end is not connected is electrically connected with a gate metal wiring 48 by the end, via a poly-silicon layer 47.

Further, the second n-type carrier storage region 82, for example, is formed concurrently with the n-type carrier storage region (hereinafter, first n-type carrier storage region) 81 of the active region 1. The second n-type carrier storage region 82 is a part extending the first n-type carrier storage region 81 inside the p-type well region 51 of the carrier drawing region 5. In other words, the second n-type carrier storage region 82 is at a depth from the front surface of the semiconductor substrate 10 equal to that of the first n-type carrier storage region 81 and has a thickness equal to a thickness of the first n-type carrier storage region 81.

The first and the second n-type carrier storage regions 81, 82, for example, are formed on the front surface of the semiconductor substrate 10, after the gate runner 42, etc. are formed by a poly-silicon layer. On the other hand, when the first and the second n-type carrier storage regions 81, 82 are formed before formation of the gate runner 42, etc., the second n-type carrier storage region 82 may penetrate the p-type well region 51 from a side toward the central part toward the chip edge, along the first and the second directions X, Y and oppose the gate runner 42 in the depth direction Z.

In the fourth embodiment, the p-type well region 51 of the carrier drawing region is in contact with the side wall furthest outward of the trench 15 disposed furthest outward along the second direction Y, and the p-type well region 51 may reach the boundary of the active region 1 and the edge termination region 2, along the first direction X.

As described, according to the fourth embodiment, the second n-type carrier storage region is provided in the p-type well region of the carrier drawing region, whereby the resistance of the p-type well region of the carrier drawing region may be increased as compared to a case in which the second n-type carrier storage region is not provided. As a result, similarly to the first to third embodiments, the avalanche capability of the edge termination region may be enhanced and therefore, the overall element avalanche capability may be enhanced. Further, according to the fourth embodiment, similarly to the first to third embodiments, since the overall element avalanche capability is determined by the avalanche capability of the active region, an IGBT may be obtained that is not destroyed in the edge termination region (carrier drawing region).

For example, when the overall element avalanche capability is determined by the avalanche capability of the edge termination region, at the moment that surge voltage occurs exceeding the clamp voltage of a protection element at the time of turn OFF of the IGBT, the element is destroyed at the edge termination region. On the other hand, when the overall element avalanche capability is determined by the avalanche capability of the active region, the avalanche capability of the edge termination region is higher than the avalanche capability of the active region and therefore, even when surge voltage occurs exceeding the clamp voltage of the protection element during turn OFF of the IGBT, the element is not destroyed at the edge termination region.

Nonetheless, in the conventional structure, to make the overall element avalanche capability dependent on the avalanche capability of the active region, the length of the edge termination region is increased to increase the avalanche capability of the edge termination region, whereby chip size and cost increase. Further, in the RC-IGBT (refer to FIG. 19) described in International Publication No. WO 2013/035818, the second n-type carrier storage region 222 is disposed in the boundary region 203 in which no electrode exists to draw out carriers and therefore, the boundary region 203 does not become a carrier drawing region.

In contrast, according to the fourth embodiment, the second n-type carrier storage region is provided in the carrier drawing region in which the emitter electrode for drawing out carriers is present. As a result, when surge voltage occurs exceeding the clamp voltage of the protection element at the time of turn OFF of the IGBT, carriers may be drawn out to the emitter electrode by both the active region and the carrier drawing region. Additionally, when surge voltage occurs exceeding the clamp voltage of the protection element at the time of turn OFF of the IGBT, the rate at which carriers are drawn out by the active region may be increased as compared to the edge termination region.

In this manner, by increasing the rate at which carriers are drawn out by the active region as compared to the edge termination region, surge voltage occurs exceeding the clamp voltage of the protection element at the time of turn OFF of the IGBT, element destruction does not occur at the edge termination region. Therefore, provision of the second n-type carrier storage region in the p-type well region of the carrier drawing region enables the avalanche capability of the edge termination region to be made higher than the avalanche capability of the active region while maintaining the length of the edge termination region. Therefore, the avalanche capability of the edge termination region may be enhanced without increases in cost.

Therefore, according to the fourth embodiment, the overall element avalanche capability may be enhanced.

Figure 17:
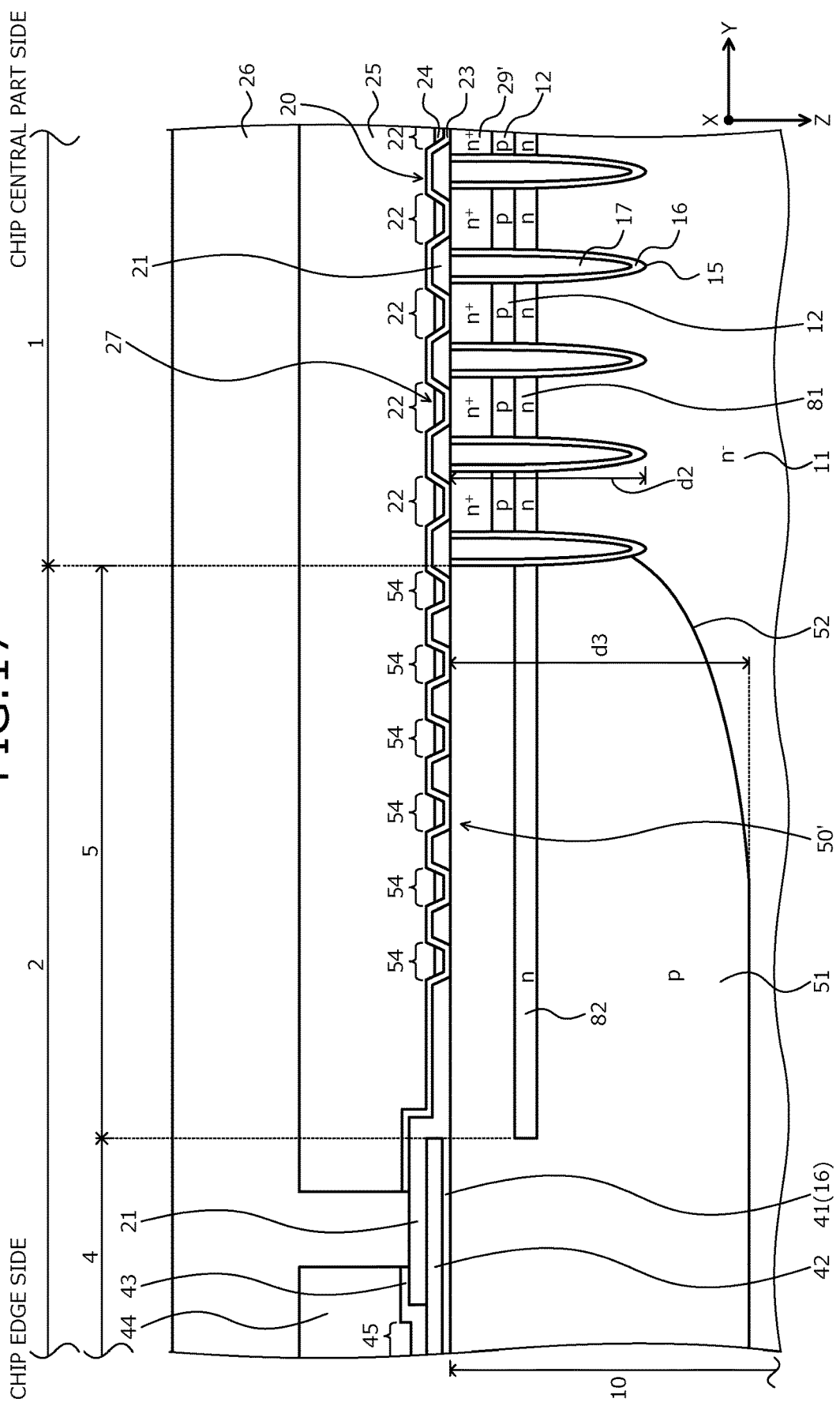
FIG. 17 is a cross-sectional view of a structure of the semiconductor device according to a fifth embodiment.

A structure of the semiconductor device according to a fifth embodiment will be described. FIG. 17 is a cross-sectional view of a structure of the semiconductor device according to the fifth embodiment. A layout of the active region 1, the breakdown voltage structure part 3, the gate runner part 4, and the carrier drawing region 5 as viewed from the front surface side of the semiconductor substrate 10 is similar to that in the first embodiment (FIGS. 1, 2). FIG. 17 is a cross-sectional view of a part of the structure at cutting line C-C' in FIG. 2 and depicts the structure near the boundary of the active region 1 and the carrier drawing region 5. A cross-section of the structure at cutting line B-B' in FIG. 2 is similar to that in FIG. 14.

The semiconductor device according to the fifth embodiment differs from the semiconductor device according to the fourth embodiment in that an $n^+$-type emitter region 29' is disposed in all of the mesa regions. In other words, the $n^+$-type emitter region 29' is provided up to and including the mesa region disposed furthest outward along the second direction Y. A reason for providing the $n^+$-type emitter region 29' in all of the mesa regions in this manner is that the second n-type carrier storage region 82 is disposed in the p-type well region 51 of the carrier drawing region.

Since the second n-type carrier storage region 82 is disposed in the p-type well region 51 of the carrier drawing region, even when the contact of the mesa region on the carrier drawing region 5 side of the active region 1 is not caused to function similarly to the contacts 50 of the carrier drawing region 5, a predetermined avalanche capability of the edge termination region may be obtained. As a result, mesa regions of the active region 1 and in which the $n^+$-type emitter region 29 is not provided are eliminated, enabling the chip size to be reduced. Alternatively, the $n^+$-type emitter region 29' is disposed in all of the mesa regions, enabling the area functioning as the IGBT to be increased.

As described, according to the fifth embodiment, even when the $n^+$-type emitter region is disposed in all of the mesa regions, effects similar to those of the first to fourth embodiments may be obtained.

Figure 18:
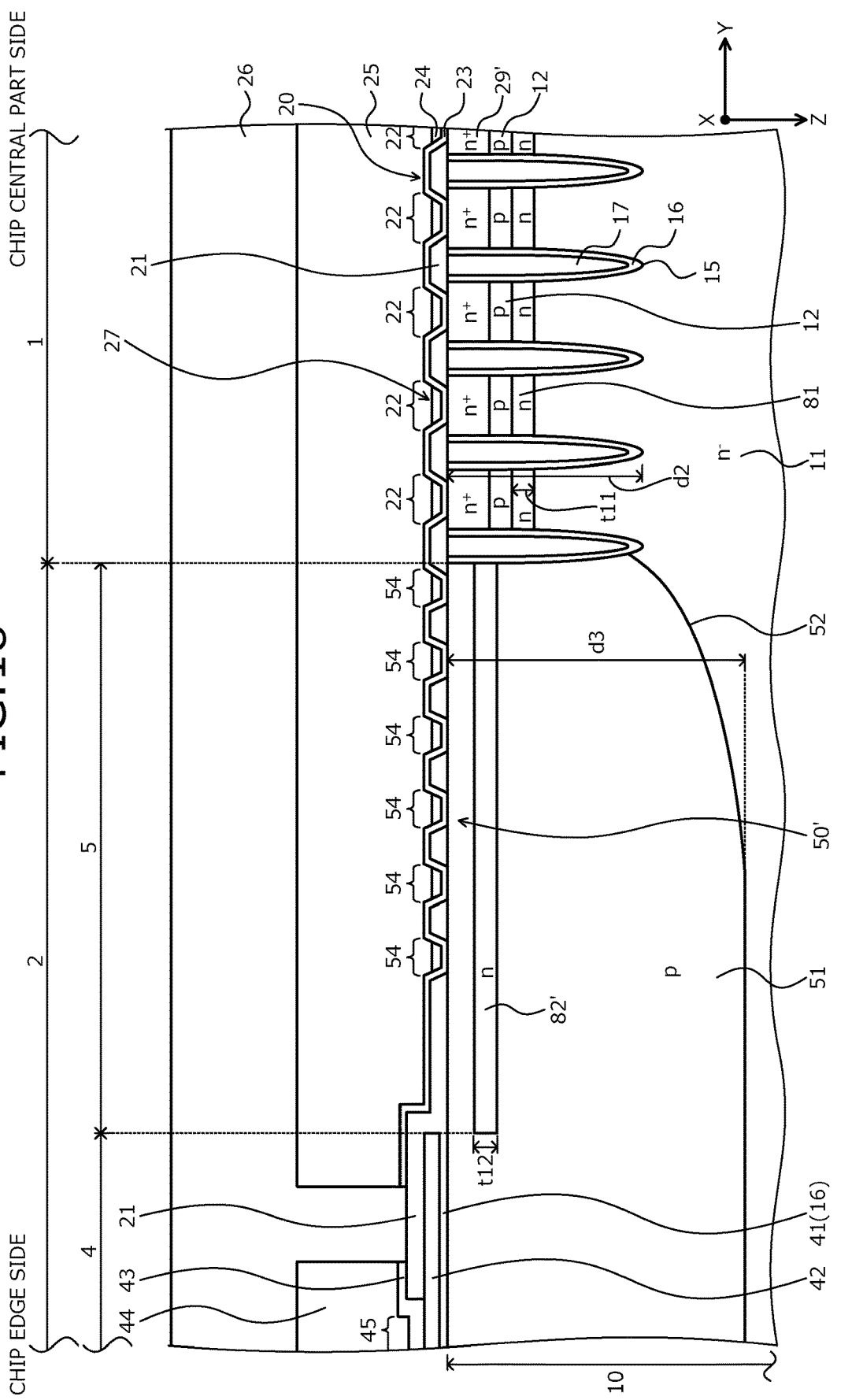
FIG. 18 is a cross-sectional view of a structure of the semiconductor device according to a sixth embodiment.
Figure 19:
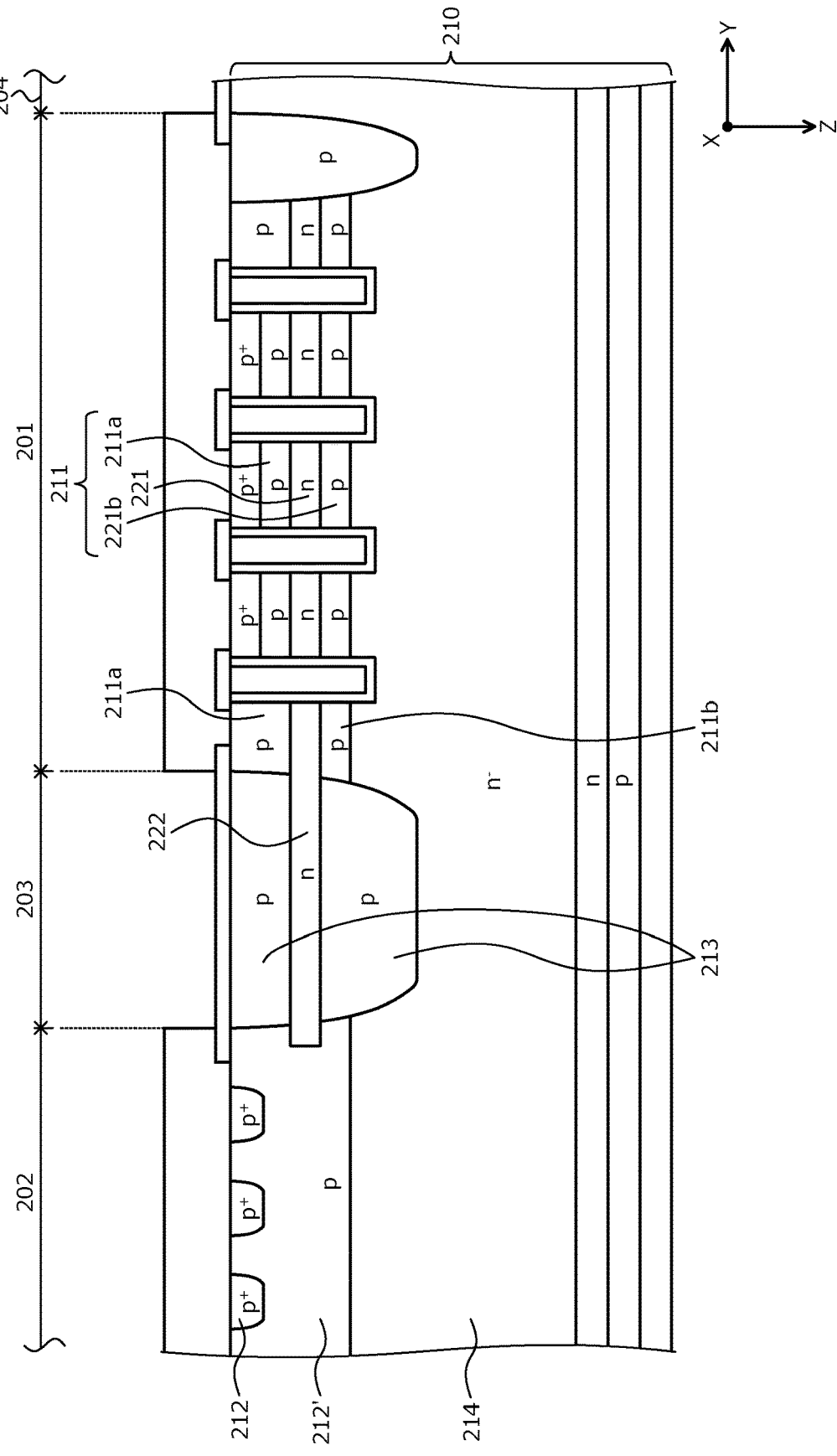
FIG. 19 is a cross-sectional view of a structure of another conventional semiconductor device.

A structure of the semiconductor device according to a sixth embodiment will be described. FIG. 18 is a cross-sectional view of a structure of the semiconductor device according to the sixth embodiment. A layout of the active region 1, the breakdown voltage structure part 3, the gate runner part 4, and the carrier drawing region 5 as viewed from the front surface side of the semiconductor substrate 10 is similar to that of the first embodiment (FIGS. 1, 2). Similarly to the fourth embodiment, an enlarged view of the rectangular frame A in FIG. 1 is depicted in FIG. 2 and an enlarged view of the rectangular frame A' in FIG. 1 is depicted in FIG. 16.

FIG. 18 is a cross-sectional view of the structure at cutting line B-B' in FIG. 2 and depicts the structure near the boundary of the active region 1 and the carrier drawing region 5. A cross-section of the structure at cutting line C-C' in FIG. 2, similarly to the fourth embodiment, is similar to that depicted in FIG. 4B with an addition of the first n-type carrier storage region 81 and an addition of the second n-type carrier storage region 82. A cross-section of the structure at cutting line D-D' in FIG. 16 is similar to that in the fourth embodiment (FIG. 15).

The semiconductor device according to the sixth embodiment differs from the semiconductor device according to the third embodiment in that a second n-type carrier storage region 82' of the carrier drawing region 5 is disposed at a depth closer to the front surface of the semiconductor substrate 10 than are the first n-type carrier storage regions 81 of the active region 1. In other words, a depth of the second n-type carrier storage region 82' of the carrier drawing region 5 is shallower from the front surface of the semiconductor substrate 10 than is a depth of the first n-type carrier storage region 81 of the active region 1.

The closer the second n-type carrier storage region 82' of the carrier drawing region 5 is the contacts 50 of the carrier drawing region 5, the greater the rate at which carriers are drawn out by the active region may be increased as compared to the edge termination region. In the sixth embodiment, the second n-type carrier storage region 82' is formed at a timing different from that of the first n-type carrier storage region 81. A thickness t12 of the second n-type carrier storage region 82' may differ from the thickness t11 of the first n-type carrier storage region 81.

As described, according to the sixth embodiment, the closer the second n-type carrier storage region of the carrier drawing region is to the contacts of the carrier drawing region, the hole current generated in the edge termination region at the time of turn OFF of the IGBT and flowing toward the active region becomes more difficult to be drawn out from the contacts of the carrier drawing region. As a result, the rate at which carriers are drawn out by the active region may be increased as compared to the edge termination region, enabling effects similar to those of the first to fifth embodiments to be obtained.

The present invention is not limited to the embodiments described and various modifications within a range not departing from the spirit of the invention are possible. For example, the present invention, without limitation to an IGBT, is further applicable to a metal oxide semiconductor field effect transistor ((MOSFET) having an insulated gate constituted by a metal oxide semiconductor of a 3-layer structure), and a reverse conducting IGBT (RC-IGBT) having a diode provided on a single semiconductor substrate (semiconductor chip) together with the IGBT.

Further, in the embodiments of the present invention, configuration may be such that only in the carrier drawing region, contacts are formed that form ohmic junctions between a semiconductor part (p$^+$-type contact region) and a barrier metal containing titanium as a main material; and in the active region, contacts are formed that form ohmic junctions of direct contact between a semiconductor part (p$^+$-type contact region) of the MOS gates and an emitter electrode containing aluminum as a main material. Further, in the embodiments of the present invention, instead of a trench gate structure, the MOS gates of the active region may have a planar structure. Further, the present invention is similarly implemented when conductivity types (n-type, p-type) are reversed.

According to the embodiments of the present invention, a contact resistance of contacts (electrical contact parts) between a fourth semiconductor region and a first electrode of a termination region may be made higher than a contact resistance of contacts between a third semiconductor region (second-conductivity-type contact region) and a first electrode of MOS gates of the active region. Therefore, hole current that is generated in the termination region at the time of turn OFF of a MOS gate type semiconductor device and that flows toward the active region may be mainly drawn out from the contacts of the MOS gates of the active region, toward the first electrode. As a result, the hole current generated in the termination region at the time of turn OFF of the MOS gate type semiconductor device may be suppressed from concentrating at the fourth semiconductor region in the termination region and having an electric potential of the first electrode.

The semiconductor device of the embodiments of the present invention achieves an effect in that the avalanche capability of the edge termination region of an IGBT may be enhanced.

As described, the semiconductor device according to the present invention has an active region and an edge termination region surrounding a periphery of the active region, is useful for power semiconductor devices used in power converting equipment, and is particularly suitable for trench gate type IGBTs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
an active region through which main current flows, the active region provided in a semiconductor substrate of a first conductivity type;
a termination region surrounding a periphery of the active region;
a first semiconductor region of a second conductivity type provided in the active region, in a surface layer on a first main surface side of the semiconductor substrate;
a second semiconductor region of the first conductivity type selectively provided in the first semiconductor region;
a third semiconductor region of the second conductivity type selectively provided in the first semiconductor region, the third semiconductor region having an impurity concentration that is higher than an impurity concentration of the first semiconductor region;
a fourth semiconductor region of the second conductivity type selectively provided in the termination region, in the surface layer on the first main surface side of the semiconductor substrate;
a fifth semiconductor region of the first conductivity type that is a region of the semiconductor substrate excluding the first semiconductor region and the fourth semiconductor region;
a gate insulating film provided in contact with a region of the first semiconductor region, the region between the fifth semiconductor region and the second semiconductor region;
a gate electrode provided opposing the first semiconductor region, across the gate insulating film;
an interlayer insulating film provided on a first main surface of the semiconductor substrate and covering the second semiconductor region, the third semiconductor region, the fourth semiconductor region and the gate electrode;
a first contact hole opened in the interlayer insulating film and exposing the second semiconductor region and the third semiconductor region;
a plurality of second contact holes opened in the interlayer insulating film, each of the plurality of second contact holes selectively exposing the fourth semiconductor region;
a first metal film provided along inner walls of the plurality of second contact holes, the first metal film having an adhesive property with the semiconductor substrate and forming an ohmic contact with the semiconductor substrate;
a second metal film embedded on the first metal film, in the plurality of second contact holes;
a first electrode provided on the interlayer insulating film and electrically connected with the first semiconductor region via the second semiconductor region and the third semiconductor region, in the first contact hole, the first electrode further electrically connected with the fourth semiconductor region via the second metal film and the first metal film, in the plurality of second contact holes; and
a second electrode provided at a second main surface of the semiconductor substrate.

2. The semiconductor device according to claim 1, further comprising
a sixth semiconductor region of the second conductivity type selectively provided in the fourth semiconductor region, the sixth semiconductor region having an impurity concentration that is higher than the impurity concentration of the third semiconductor region, wherein
the first electrode is electrically connected with the fourth semiconductor region via the second metal film, the first metal film and the sixth semiconductor region, in the plurality of second contact holes.

3. The semiconductor device according to claim 1, further comprising
a seventh semiconductor region of the second conductivity type selectively provided in the third semiconductor region, the seventh semiconductor region having an impurity concentration that is higher than the impurity concentration of the third semiconductor region, wherein
the first electrode is electrically connected with the first semiconductor region via the seventh semiconductor region and the third semiconductor region, in the first contact hole.

4. The semiconductor device according to claim 1, wherein
the fourth semiconductor region surrounds the periphery of the active region along an outer periphery of the active region, and
the plurality of second contact holes are disposed in a striped layout extending along the outer periphery of the active region and surround the periphery of the active region.

5. The semiconductor device according to claim 1, wherein
a width of the plurality of second contact holes is in a range from 0.3 µm to 1.0 µm.

6. The semiconductor device according to claim 1, wherein
a width between the plurality of second contact holes is equal to the width of the plurality of second contact holes.

7. The semiconductor device according to claim 1, further comprising
a gate runner provided on the first main surface of the semiconductor substrate via an insulating layer, in the termination region, the gate runner opposing the fourth semiconductor region, across the insulating layer, and electrically connected with the gate electrode, wherein
the plurality of second contact holes are provided from a boundary of the active region and the termination region to the gate runner.

8. The semiconductor device according to claim 7, wherein a distance from the boundary of the active region and the termination region to the gate runner is at least 5 µm.

9. The semiconductor device according to claim 1, wherein
the first electrode forms an ohmic contact with second semiconductor region and with the third semiconductor region.

10. The semiconductor device according to claim 1, wherein
the first metal film is provided along an inner wall of the first contact hole, and
the second metal film is embedded on the first metal film in the first contact hole.

11. The semiconductor device according to claim 1, wherein
the first metal film contains titanium as a main material.

12. The semiconductor device according to claim 1, wherein
the second metal film contains tungsten as a main material.

13. The semiconductor device according to claim 1, further comprising
a trench that reaches the fifth semiconductor region from a top of the first semiconductor region, wherein
the gate insulating film is provided along an inner wall of the trench, and
the gate electrode is embedded in the gate insulating film in the trench.

14. The semiconductor device according to claim 1, further comprising
an eighth semiconductor region of the first conductivity type between the first semiconductor region and the fifth semiconductor region, the eighth semiconductor region having an impurity concentration that is higher than an impurity concentration of the fifth semiconductor region.

15. The semiconductor device according to claim 14, further comprising
a ninth semiconductor region of the first conductivity type in the fourth semiconductor region, the ninth semiconductor region being separated from the first main surface of the semiconductor substrate and opposing the plurality of second contact holes in a depth direction, the ninth semiconductor region having an impurity concentration that is higher than the impurity concentration of the fifth semiconductor region.

16. The semiconductor device according to claim 15, further comprising
a gate pad provided on the first main surface of the semiconductor substrate via an insulating layer, in the termination region, the gate pad opposing the fourth semiconductor region, across the insulating layer in the depth direction, and electrically connected with the gate electrode, wherein
the ninth semiconductor region extends from an active region side toward a gate pad side, and terminates further on the active region side than does the gate pad.

17. The semiconductor device according to claim 15, wherein
the ninth semiconductor region is positioned at a depth from the first main surface of the semiconductor substrate equal to a depth of the eighth semiconductor region.

18. The semiconductor device according to claim 15, wherein
the ninth semiconductor region is positioned at a depth from the first main surface of the semiconductor substrate shallower than a depth of the eighth semiconductor region.

19. The semiconductor device according to claim 15, further comprising
a trench that reaches the fifth semiconductor region from a top of the first semiconductor region, wherein
the gate insulating film is provided along an inner wall of the trench,
the gate electrode is embedded in the gate insulating film in the trench,
the trench is disposed in plural in a striped shape extending along a direction parallel to the first main surface of the semiconductor substrate, and the second semiconductor region is provided between all adjacent trenches.

* * * * *